(12) United States Patent
Watanabe et al.

(10) Patent No.: US 7,067,919 B2
(45) Date of Patent: Jun. 27, 2006

(54) SEMICONDUCTOR DEVICE

(75) Inventors: Kenichi Watanabe, Kawasaki (JP);
Noriyoshi Shimizu, Kawasaki (JP);
Takashi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 265 days.

(21) Appl. No.: 10/309,113

(22) Filed: Dec. 4, 2002

(65) Prior Publication Data
US 2003/0116852 A1 Jun. 26, 2003

(30) Foreign Application Priority Data
Dec. 12, 2001 (JP) ........................................ 2001-390710

(51) Int. Cl.
*H01L 23/48* (2006.01)

(52) U.S. Cl. ........................ 257/758; 257/750; 257/700; 257/701; 257/774; 257/773

(58) Field of Classification Search ................. 257/758, 257/750, 700, 701, 774, 773
See application file for complete search history.

(56) References Cited

U.S. PATENT DOCUMENTS

| 5,556,805 A | * | 9/1996 | Tanizawa et al. | ............ 438/637 |
| 5,793,113 A | | 8/1998 | Oda | |
| 6,333,558 B1 | * | 12/2001 | Hasegawa | .................... 257/759 |
| 6,417,575 B1 | | 7/2002 | Harada et al. | ............... 257/784 |
| 6,448,134 B1 | * | 9/2002 | Kim | ............................ 438/253 |
| 6,489,684 B1 | * | 12/2002 | Chen et al. | .................. 257/774 |
| 2002/0074611 A1 | * | 6/2002 | Koubuchi et al. | .......... 257/401 |
| 2002/0074663 A1 | * | 6/2002 | Wong | .......................... 257/759 |
| 2003/0089996 A1 | * | 5/2003 | Hau-Riege | .................. 257/774 |

FOREIGN PATENT DOCUMENTS

| CN | 1327266 A | | 12/2001 |
| JP | 10-233442 | | 9/1998 |
| JP | 11-243146 | | 9/1999 |
| JP | 2000012688 A | * | 1/2000 |
| JP | 2001-44196 | | 2/2001 |

OTHER PUBLICATIONS

Chinese Office Action dated Jul. 9, 2004.

* cited by examiner

*Primary Examiner*—Nathan J. Flynn
*Assistant Examiner*—Remmon R. Fordé
(74) *Attorney, Agent, or Firm*—Armstrong, Kratz, Quintos, Hanson & Brooks, LLP

(57) ABSTRACT

A semiconductor device including a second insulating film formed on a substantially flat surface, on which a surface of a first wiring and a surface of a first insulating film are continued, to cover the first wiring, a wiring trench formed in the second insulating film, connection holes formed in the second insulating film to extend from the wiring trench to the first wiring, dummy connection holes formed in the second insulating film to extend from the wiring trench to a non-forming region of the first wiring, and a second wiring buried in the connection holes and the wiring trench to be connected electrically to the first wiring and also buried in the dummy connection holes, and formed such that a surface of the second wiring and a surface of the second insulating film constitute a substantially flat surface.

2 Claims, 24 Drawing Sheets

An Extending Direction of
the Second Wiring 39

A Direction Perpendicular to
the Extending Direction of
the Second Wiring 39

An Extending Direction of
the Second Wiring 39

A Direction Perpendicular to
the Extending Direction of
the Second Wiring 39

SEMICONDUCTOR DEVICE

CROSS-REFERENCE TO RELATED APPLICATIONS

This application is based upon and claims priority of Japanese Patent Application No. 2001-390710, filed Dec. 21, 2001, the entire contents of which are incorporated herein by reference.

BACKGROUND OF THE INVENTION

1. Field of the Invention

The present invention relates to a semiconductor device and, more particularly, to a semiconductor device manufactured by the damascene process.

2. Description of the Related Art

In recent years, with the improvement in the integration density of the semiconductor device, the miniaturization of the wiring is required. As the method of forming the wiring, there is the method of forming the barrier metal layer on the aluminum film and then forming the aluminum wiring by patterning directly the aluminum film and the barrier metal layer. According to this method, because the etching of the aluminum film progress in the lateral direction during the patterning, not only the wiring width is unnecessarily narrowed, but also the barrier metal layer remains on the aluminum wiring like a pent roof. In this manner, this method has a difficulty in manufacturing a precise wiring and poses a limit on progress in miniaturization of the wiring.

In contrast, in the so-called damascene process, the metal film is not directly patterned as in the above. In stead, the wiring is formed by forming the trench by etching the insulating film and then burying the metal, such as the copper or the like, in this trench. Because the etching object is the insulating film, the above disadvantage does not occur in the damascene process and thus the wiring can be miniaturized as desired. In addition, because the copper wiring having a lower resistance than that of the aluminum wiring can be formed in the damascene process, the operation speed of the semiconductor device can be increased.

The damascene process is roughly classified into two categories, single damascene process and the dual damascene process.

FIG. 19 is a sectional view showing the semiconductor device manufactured by the single damascene process in the prior art. In FIG. 19, reference numeral 3 denotes the first wiring that consists of the barrier metal layer 2 and the metal film 1. Such first wiring 3 is buried in the wiring trench 12a in the insulating film 12.

On the other hand, reference numeral 8 denotes the second wiring that consists of the barrier metal layer 6 and the metal film 7, and is buried in the wiring trench 5a in the upper insulating film 5. This second wiring 8 and the above first wiring 3 are connected electrically via the conductive plug 11 (referred to as the "plug" hereinafter). Such plug 11 has the double-layered structure consisting of the barrier metal layer 9 and the metal film 10, and is buried in the via hole 4a in the lower insulating film 4.

In order to obtain the above structure by the single damascene process, the plug 11 is buried in the via hole 4a after the lower insulating film 4 is formed. Then, the upper insulating film 5 is formed on the lower insulating film 4, and then the wiring trench 5a is formed in the upper insulating film 5. Then, the second wiring 8 connected to the plug 11 is buried in the wiring trench 5a.

In this manner, because the plug 11 and the second wiring 8 are formed separately in the single damascene process, such a structure is formed that the metal film 10 and the metal film 7 are isolated by the barrier metal layer 6.

On the other hand, FIG. 20 is a sectional view showing the semiconductor device manufactured by the dual damascene process in the prior art. In FIG. 20, the same reference numeral as those in FIG. 19 are affixed to the same constituent members as those in FIG. 19, and their explanation will be omitted hereunder.

In order to obtain this structure by the dual damascene process, the lower insulating film 4 and the upper insulating film 5 are laminated and then the wiring trench 5a and the via hole 4a are formed in these insulating films. Then, the barrier metal layer 13 is formed simultaneously on each inner walls of the wiring trench 5a and the via hole 4a. Then, the plug 11 and the second wiring 8 are simultaneously formed by forming the metal film 14 on the barrier metal layer 13. Both the plug 11 and the second wiring 8 have the double-layered structure of the barrier metal layer 13 and the metal film 14.

In this way, in the dual damascene process, the plug 11 and the second wiring 8 are formed simultaneously. As a result, the plug 11 and the second wiring 8 are not isolated by the barrier metal layer but are formed integrally.

As described above, both the single and dual damascene process can miniaturize the wiring and improve the integration density of the semiconductor device.

Such semiconductor device, however, is still to be improved its stress migration resistance. The stress migration is the phenomena where the metal film 14, in some cases the barrier metal layer 13 as well, is lifted up in the via hole 4a due to the difference in physical constants such as the thermal expansion coefficient, etc. between the metal film 14 and the insulator (the upper insulating film 5 or the lower insulating film 4) to cause the connection failure between the plug 11 and the first wiring 3.

If the stress migration is ready to occur in this manner, the fraction defective increases in the thermal process in the course of the manufacture, which brings about such a disadvantage that the production cost of the semiconductor device increases.

SUMMARY OF THE INVENTION

It is an object of the present invention to provide a semiconductor device whose stress migration resistance is improved over that of the prior art.

The above object can be achieved by providing a semiconductor device which comprises a second insulating film formed on a substantially flat surface, on which a surface of a first wiring and a surface of a first insulating film are continued, to cover the first wiring; a wiring trench formed in the second insulating film; a connection hole formed in the second insulating film to extend from the wiring trench to the first wiring; a dummy connection hole formed in the second insulating film to extend from the wiring trench to a non-forming region of the first wiring; and a second wiring buried in the connection hole and the wiring trench to be connected electrically to the first wiring and also buried in the dummy connection hole, and formed such that a surface of the second wiring and a surface of the second insulating film constitute a substantially flat surface.

It is known that as the wiring length becomes longer, the stress migration is more likely to be occurred in the aluminum wiring that is formed, not by the damascene process, by patterning directly the aluminum film. In the present specification, the wiring length is defined as the distance between the centers of two neighboring plugs on the same wiring (see FIG. 20).

In contrast, it is not known in the damascene process that the stress migration exhibits such dependency on the wiring length in this manner.

However, the inventors of the present application found the fact that the second wiring 8 formed by the damascene process also shows the above dependency on the wiring length and also the stress migration is ready to occur as the wiring length becomes longer. In particular, the inventors of the present application found that the stress migration is easily caused in the wiring formed by the dual damascene process compared to that formed by the single damascene process.

This is because, as shown in FIG. 20, the plug 11 and the second wiring 8 are formed integrally in the dual damascene process and thus the metal film 14 of the plug 11 can be easily moved to the second wiring 8 by the thermal stress. Such circumstance is hard to occur in the single damascene process in which the plug 11 and the second wiring 8 are isolated by the barrier metal layer 6 (see FIG. 19).

According to the present invention, portion of the second wiring, which is buried in the connection hole in the second insulating film, serve as the conductive plugs. Also, portions of the second wiring, which is buried in the dummy connection hole in the second insulating film, serve as the dummy conductive plugs.

A positional relationship between these plugs (including the conductive plugs and the dummy conductive plugs) is argued in the following. It should be noted that this argument is still valid even if the above positional relationship is replaced with that between the connection holes (including the connection holes and the dummy connection holes).

According to the present invention, by providing the dummy conductive plug, the wiring length of the second wiring, which is originally defined as a distance between the neighboring conductive plugs, can be seen to be shortened to the distance between the dummy conductive plugs and the conductive plugs. Therefore, the stress-migration, which occurs frequently when the wiring length is long, can be reduced.

Also, according to the simulation results, it became apparent that providing dummy conductive plug around the conductive plug reduced the stress-migration, even if in the situation where the wiring length of the second wiring could not be defined as in the case where only one conductive plug was provided on the solid second wiring.

In addition, the dummy wiring may be provided in the non-forming region of the first wiring, and the dummy connection hole in the second insulating film may be formed so as to reach the dummy wiring. If doing so, the dummy conductive plugs are connected to the dummy wiring. Because the second wiring can be supported firmly by the dummy conductive plugs that uses the dummy wiring as its foundation, the mechanical strength of the laminated body consisting of the second insulating film and the second wiring can be enhanced.

Where the dummy wiring is provided, it is preferable that a total wiring occupation ratio, incorporating both the first wiring and the dummy wiring, is substantially constant in a plane. If doing so, heights of the dummy wiring and the first wiring after polishing can easily be controlled as desired when the CMP (Chemical Mechanical Polishing) is carried out.

In addition, the stress-migration can be reduced desirably when $p_1$, an interval between neighboring dummy conductive plugs (i.e., an interval between neighboring dummy connection holes), is less than 1 µm.

In particular, when the interval $p_1$ is smaller than 0.6 µm, the stress-migration can be reduced more effectively.

Similarly, the stress-migration can be reduced preferably when $p_2$, an interval between neighboring conductive plug and dummy conductive plug (i.e., an interval between neighboring connection hole and dummy connection hole), is set to less than 1 µm.

Then, when this interval $p_2$ is set smaller than 0.6 µm, the stress-migration can be reduced more effectively.

Where plural second wirings are arranged in one region, it is preferable to reduce the inter-wiring capacitance between neighboring second wirings. To this end, a part of the conductive plugs or the dummy conductive plugs, which are buried in one second wiring, and a part of the conductive plugs or the dummy conductive plugs, which are buried in other second wiring, may be arranged not to oppose mutually in a direction perpendicular to any one of extending directions of two neighboring second wirings. By doing this, because each plugs in neighboring second wirings (including the conductive plugs and the dummy conductive plugs) are not arranged to oppose to each other, the opposing capacitance between the plugs can be reduced and thus the increase in the inter-wiring capacitance between the second wirings due to the opposing capacitance can be prevented.

Further, a third insulating film for covering the second wiring may be formed on the second wiring. In this case, as in the second insulating film, the wiring trench, the connection holes, and the dummy connection holes are formed in the third insulating film, and a third wiring is buried in them.

If the third wiring is provided in this manner, it is preferable to reduce the inter-wiring capacitance between the third wiring and the second wiring. To this end, when viewed from the upper side of the third wiring, a part of the conductive plugs and the dummy conductive plugs formed in the second wiring and a part of the conductive plugs and the dummy conductive plugs formed in the third wiring are arranged not to oppose mutually in the direction that is perpendicular to any one of extending directions of the second wiring and the third wiring. By doing this, because each plugs (the conductive plugs and the dummy conductive plugs) formed in different wirings (the second wiring and the third wiring) are not arranged adjacently, the opposing capacitance between the plugs can be reduced and thus the increase in the inter-wiring capacitance between the second wiring and the third wiring due to the opposing capacitance can be prevented.

Then, it is preferable that the insulating film having a film made of polyarylether material should be employed as the first insulating film or the second insulating film. If such insulating film is employed, the inter-wiring capacitance can be reduced and thus an operation speed of the semiconductor device can be increased.

DESCRIPTION OF THE PREFERRED EMBODIMENTS

Next, embodiments of the present invention will be explained in detail with reference to the accompanying drawings hereinafter.

(1) First Embodiment

Figure 1:
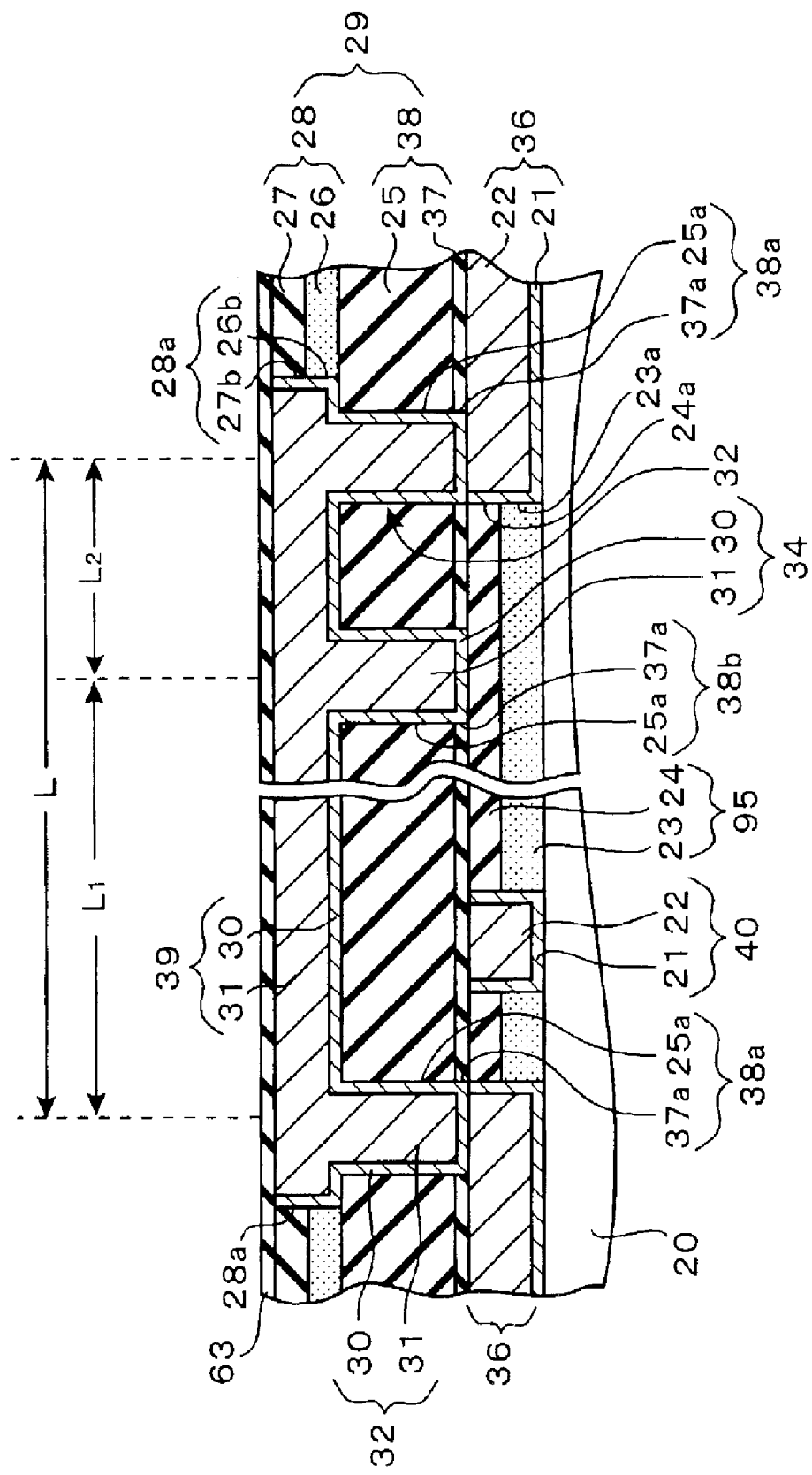
FIG. 1 is a sectional view showing a semiconductor device according to a first embodiment of the present invention.

FIG. 1 is a sectional view showing a semiconductor device according to a first embodiment of the present invention.

In FIG. 1, reference numeral 20 denotes an underlying layer. This underlying layer 20 has a structure in which, for example, a MOSFET is formed in an active region of a silicon wafer (semiconductor substrate), then an insulating film is formed on a surface of the wafer, and then a conductive plug is buried in the insulating film. A low-dielectric insulating film 23 (film thickness: about 250 nm) and a silicon oxide film 24 (film thickness: about 250 nm) are laminated on such underlying layer 20. A first insulating film 95 is constituted of the low-dielectric insulating film 23 and the silicon oxide film 24.

In the present specification, the low-dielectric insulating film is defined as the insulating film whose dielectric constant is lower than the dielectric constant (4.1) of the silicon oxide film. For such insulating films, there is the insulating film made of polyarylether material, for example. As the insulating film made of polyarylether material, there is SiLK (trademark of The Dow Corning Co.). Because such SiLK has the low dielectric constant, the inter-wiring capacitance can be reduced and thus the operation speed of the semiconductor device can be increased.

Openings 23a, 24a are formed in the low-dielectric insulating film 23 and the silicon oxide film 24 respectively. A barrier metal layer 21 (film thickness: about 50 nm) is formed on inner walls of the openings 23a, 24a. Such barrier metal layer 21 is made of the refractory metal such as Ta (tantalum), etc., for example.

Reference numeral 22 denotes a copper film that is formed on the barrier metal layer 21. A first wiring 36 is constituted of such copper film 22 and the barrier metal layer 21. The barrier metal layer 21 prevents copper contained in the copper film 22 from diffusing into the low-dielectric insulating film 23 and the silicon oxide film 24.

In order to form such first wiring 36, first the barrier metal layer 21 is formed on the inner walls of the openings 23a, 24a respectively and then the copper film 22 is formed thereon. Then, the barrier metal layer 21 and the copper film 22, which are formed at the higher level than the silicon oxide film 24, are polished and removed by the CMP (Chemical Mechanical Polishing) method, whereby the above structure can be obtained. Because the CMP is applied, each surfaces of the first wiring 36 and the first insulating film 95 are made substantially flat.

Then, a second insulating film 29 is formed on the substantially flat surface on which each surfaces of the first wiring 36 and the first insulating film 95 are continued. The first wiring 36 is covered with the second insulating film 29. The second insulating film 29 is constituted by laminating a lower insulating film 38 and an upper insulating film 28. These insulating films 38, 28 are also constituted by laminating various insulating films. For example, the lower insulating film 38 is constituted by laminating a silicon nitride film 37 (film thickness: about 50 nm) and a silicon oxide film 25 (film thickness: about 700 nm). Then, the upper insulating film 28 is formed by laminating a low-dielectric insulating film 26 (film thickness: about 250 nm) and a silicon oxide film 27 (film thickness: about 250 nm). Among these films, the low-dielectric insulating film 26 is made of the same material for the low-dielectric insulating film 23, such as SiLK.

Reference numeral 28a denotes a wiring trench. This wiring trench 28a is constructed by openings 26b, 27b formed in the low- dielectric insulating film 26 and the silicon oxide film 27 respectively. A via hole (connection hole) 38a extending from the wiring trench 28a to the first wiring 36 and a dummy via hole (dummy connection hole) 38b extending from the wiring trench 28a to a non-forming region of the first wiring 36 are formed in the lower insulating film 38. The via hole 38a and the dummy via hole 38b are constructed by openings 37a, 25a, which are formed in the silicon nitride film 37 and the silicon oxide film 25 respectively.

Reference numeral 30 denotes a barrier metal layer (film thickness: about 50 nm) formed on inner walls of the via hole 38a and the dummy via hole 38b and is made of the refractory metal such as Ta (tantalum), or the like, for example. This barrier metal layer 30 is also formed on the first wiring 36 exposed from, a bottom of the via hole 38a. A copper film 31 is buried in the via hole 38a, the dummy via hole 38b, and the wiring trench 28a via the barrier metal layer 30.

Reference numeral 39 denotes a second wiring buried in the wiring trench 28a, and has a double-layered structure of the barrier metal layer 30 and the copper film 31. A silicon nitride film 63 is formed on the second wiring 39.

The second wiring 39 is also buried in the via hole 38a and the dummy via hole 38b. The portion of the second wiring 39, which is buried in the via hole 38a, serves as a conductive plug 32 (referred to as a "plug" hereinafter). The portion of the second wiring 39, which is buried in the dummy via hole 38b, serves as a dummy conductive plug 34 (referred to as a "dummy plug" hereinafter).

A positional relationship between the plugs (including the plug 32 and the dummy plug 34) is argued in the following. In this case, it should be noted that this positional relationship can be replaced with that between the holes (including the via hole 38a and the dummy via hole 38b).

As will be described later, this semiconductor device is manufactured by the dual damascene process. Therefore, the second wiring 39 is formed integrally with the plug 32 and the dummy plug 34. Such feature is not found in the single dual damascene process in which the barrier metal layer is interposed between the wiring and the plug.

The plug 32 is also electrically connected to the first wiring 36, and functions to connect the first wiring 36 to the second wiring 39 electrically.

On the other hand, the dummy plug 34 constitutes one of the features of the present invention. In FIG. 1, L denotes a distance between centers of each neighboring plugs 32, 32. Where the dummy plug 34 is absent, this L gives a wiring length of the second wiring 39.

However, where the dummy via hole 38b is provided and the dummy plug 34 is buried therein as in the present invention, the distance between the neighboring plugs (including the plug 32 and the dummy plug 34) can been seen as L1 or L2, and become shorter than the above L. Accordingly, in the present invention, the stress migration that occurs frequently when the wiring length is long can be suppressed, and the lifting-up of the copper film 31 in the via hole 38a can be suppressed, so that the connection failure between the plug 32 and the first wiring 36 can be prevented. As a result, because the fraction defective of the semiconductor device in the thermal process can be lowered, the yield of the semiconductor device can be improved consequently and thus a production cost of the semiconductor device can be reduced.

Also, because a sectional area of the second wiring 39 increases in the portion where the dummy plug 34 is provided, the resistance of the wiring can be reduced. Accordingly, it is also made possible to increase the operation speed of the semiconductor device.

In addition, because this dummy plug 34 can also act as a source of copper atoms that move in the second wiring 39 together with the electrons, the situation where the second wiring 39 is disconnected because of the lack of the copper atoms, i.e., the so-called electromigration, can also be prevented.

The number of the dummy via holes 38b is not limited. The above advantage can be obtained by providing arbitrary number of the dummy via holes 38b.

In FIG. 1, reference numeral 40 denotes a different-potential wiring that has a different potential than the first wiring 36. It is preferable that the dummy via holes 39b is formed out of this different-potential wiring 40. This is because, if the dummy plug 34 is connected to the different-potential wiring 40, the first wiring 36 and the different-potential wiring 40 are electrically connected and hence the circuit cannot desirably function.

Figure 2:
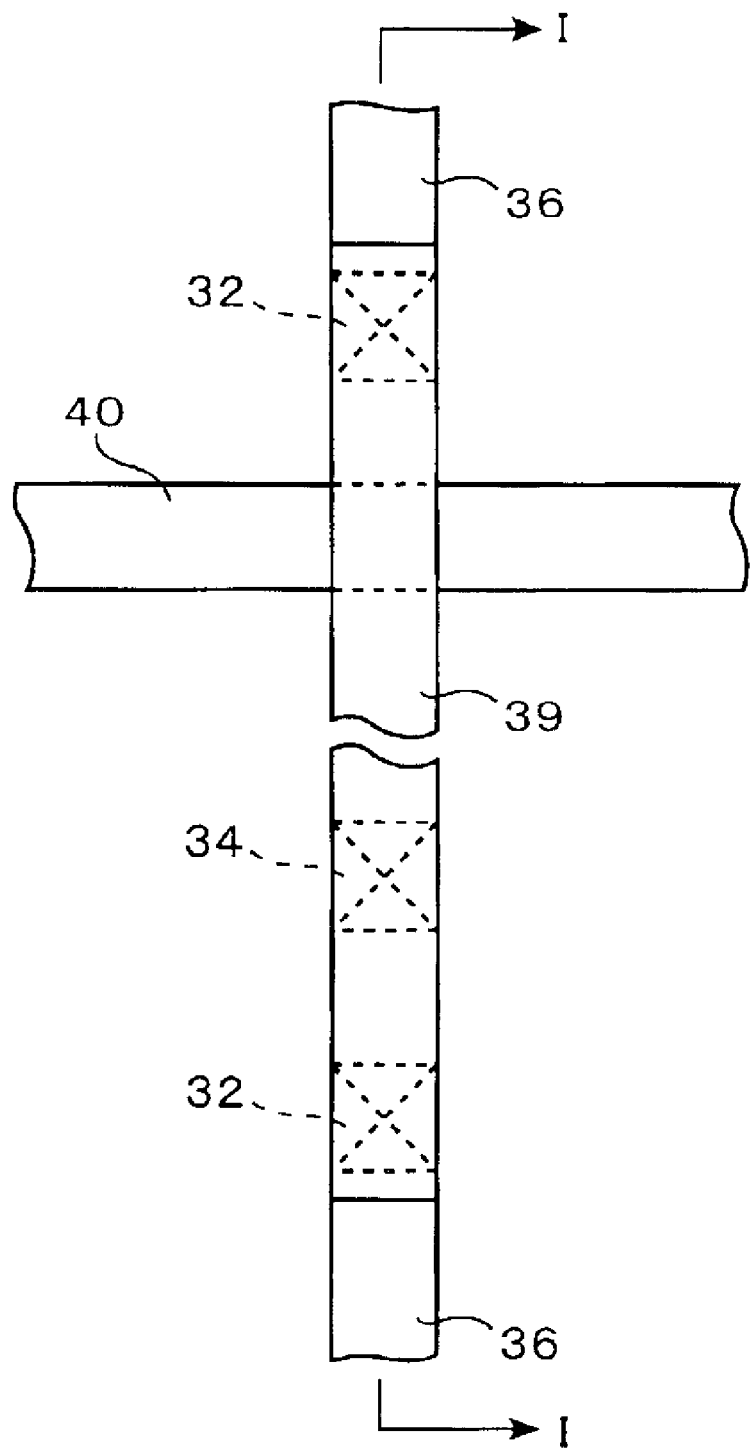
FIG. 2 is a plan view showing the semiconductor device according to the first embodiment of the present invention.

A planar arrangement of each plugs are shown in FIG. 2. FIG. 2 is a plan view showing the semiconductor device according to the first embodiment. In FIG. 2, for easy understanding of the arrangement of the plugs, the underlying layer 20 (see FIG. 1) and each insulating films are omitted. Also, above FIG. 1 corresponds to the sectional view taken along a I—I line in FIG. 2.

Next, results of simulations about the present embodiment made by the inventors of the present invention will be explained with reference to FIGS. 15A and 15B and FIGS. 16A and 16B hereunder.

Figure 15A:
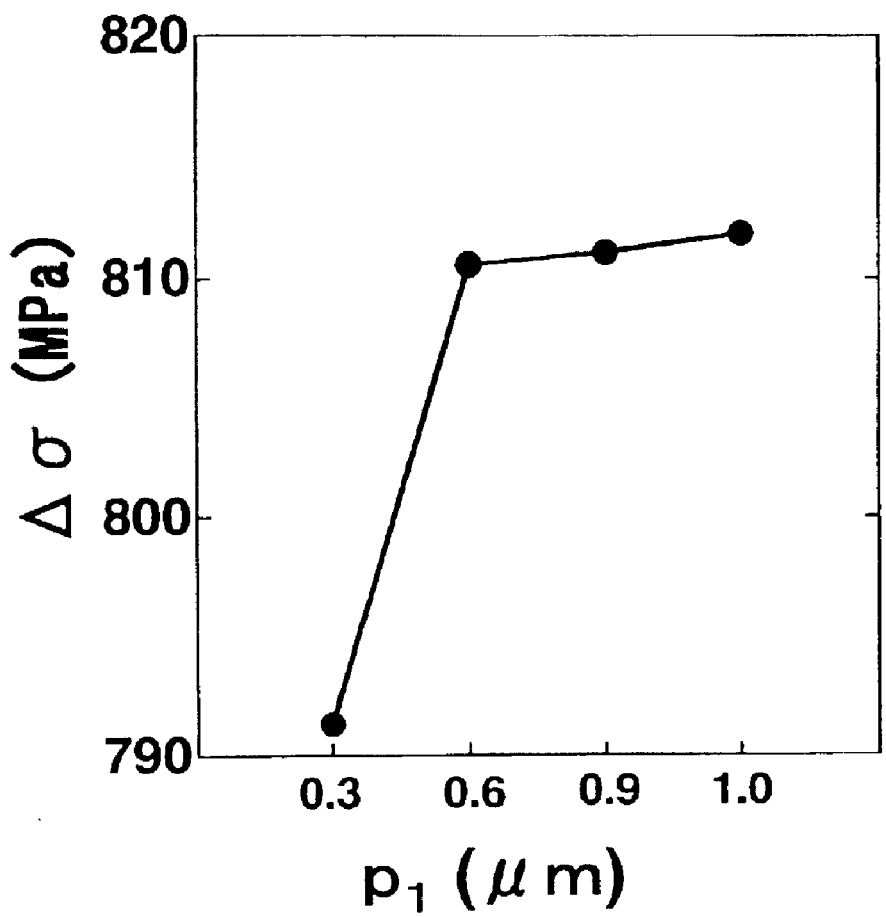
FIG. 15A is a graph showing a first simulation result of the semiconductor device according to the first embodiment of the present invention.
Figure 15B:
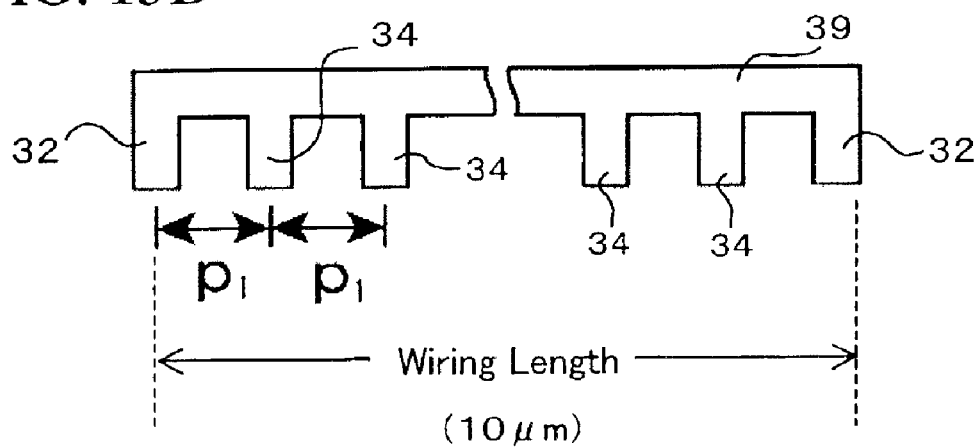
FIG. 15B is a sectional view showing a model used in this simulation.
Figure 16A:
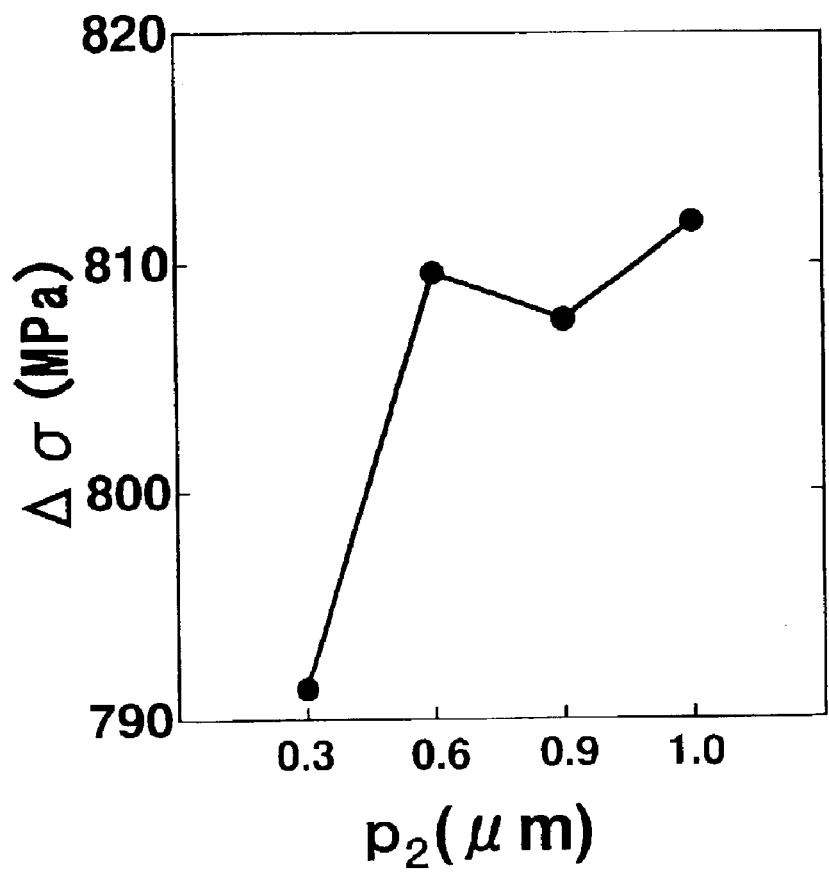
FIG. 16A is a graph showing a second simulation result of the semiconductor device according to the first embodiment of the present invention.
Figure 16B:
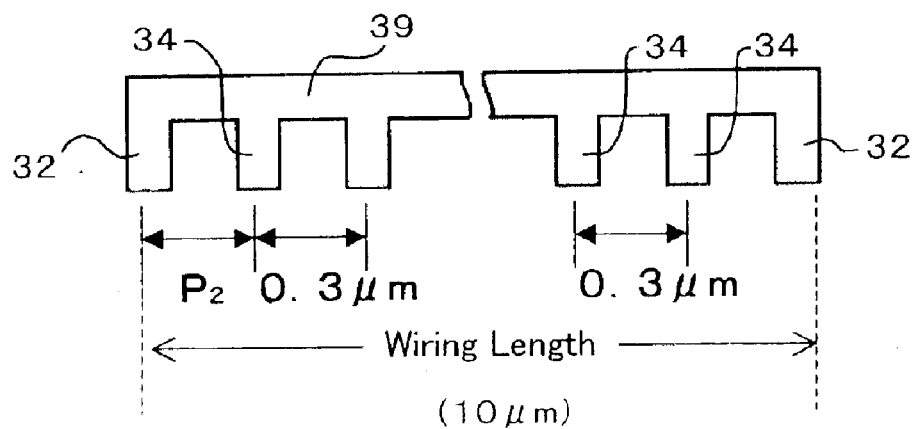
FIG. 16B is a sectional view showing a model used in this simulation.

FIG. 15A is a graph showing a first simulation result of the semiconductor device according to the first embodiment, and FIG. 15B is a sectional view showing a model used in this simulation. FIG. 16A is a graph showing a second simulation result of the semiconductor device according to the first embodiment, and FIG. 16B is a sectional view showing a model used in this simulation.

In the simulations in FIGS. 15A, 15B, 16A, and 16B, the distance between the centers of the neighboring plugs 32, 32 (i.e., the wiring length) was fixed to 10 µm. Then, as the model of the plug 32 and the dummy plug 34, a circular cylinder whose diameter is 0.15 µm and whose height is 0.42 µm was employed.

In the first simulation (FIGS. 15A and 15B), a difference $\Delta\sigma$ of vertical components of the stress on the upper surface and the lower surface of the plug 32 was investigated while varying a pitch (interval) $p_1$ between the neighboring dummy plugs 34, 34. If the difference $\Delta\sigma$ is large, a force applied to the plug 32 in the vertical direction becomes large and therefore the plug 32 is ready to peel from the first wiring 36 (see FIG. 1). In other words, if the difference $\Delta\sigma$ is large, the stress-migration is ready to occur.

As can be seen from FIG. 15A, the difference a tends to decrease in the range where the pitch $p_1$ is smaller than 1 µm and thus the stress-migration is hard to occur. In particular, if the pitch $p_1$ is smaller than 0.6 µm, the difference $\Delta\sigma$ decreases abruptly. Therefore, in order to prevent the stress-migration, it is preferable that the pitch $p_1$ is less than 1 µm. Also, in order to prevent the stress-migration more effectively, it is preferable that the pitch $p_1$ is less than 0.6 µm.

Also, in the second simulation (FIGS. 16A and 16B), a dependency of the above difference $\Delta\sigma$ on a first pitch $p_2$ (an interval between the plug 32 and the dummy plug 34 being arranged adjacently) was investigated while varying the first pitch $p_2$. In this case, the distance between the neighboring dummy plugs 34, 34 was fixed to 0.3 µm.

As can be seen from FIG. 16A, the difference $\Delta\sigma$ tends to decrease in the range where the first pitch $p_2$ is smaller than 1 µm and thus the stress-migration is hard to occur. In particular, if the first pitch $p_2$ is smaller than 0.6 µm, the difference $\Delta\sigma$ decreases abruptly. Therefore, in order to prevent the stress-migration, it is preferable that the first pitch $p_2$ is less than 1 µm. Also, in order to prevent the stress-migration more effectively, it is preferable that the first pitch $p_2$ is less than 0.6 µm.

(2) Second Embodiment

Figure 3:
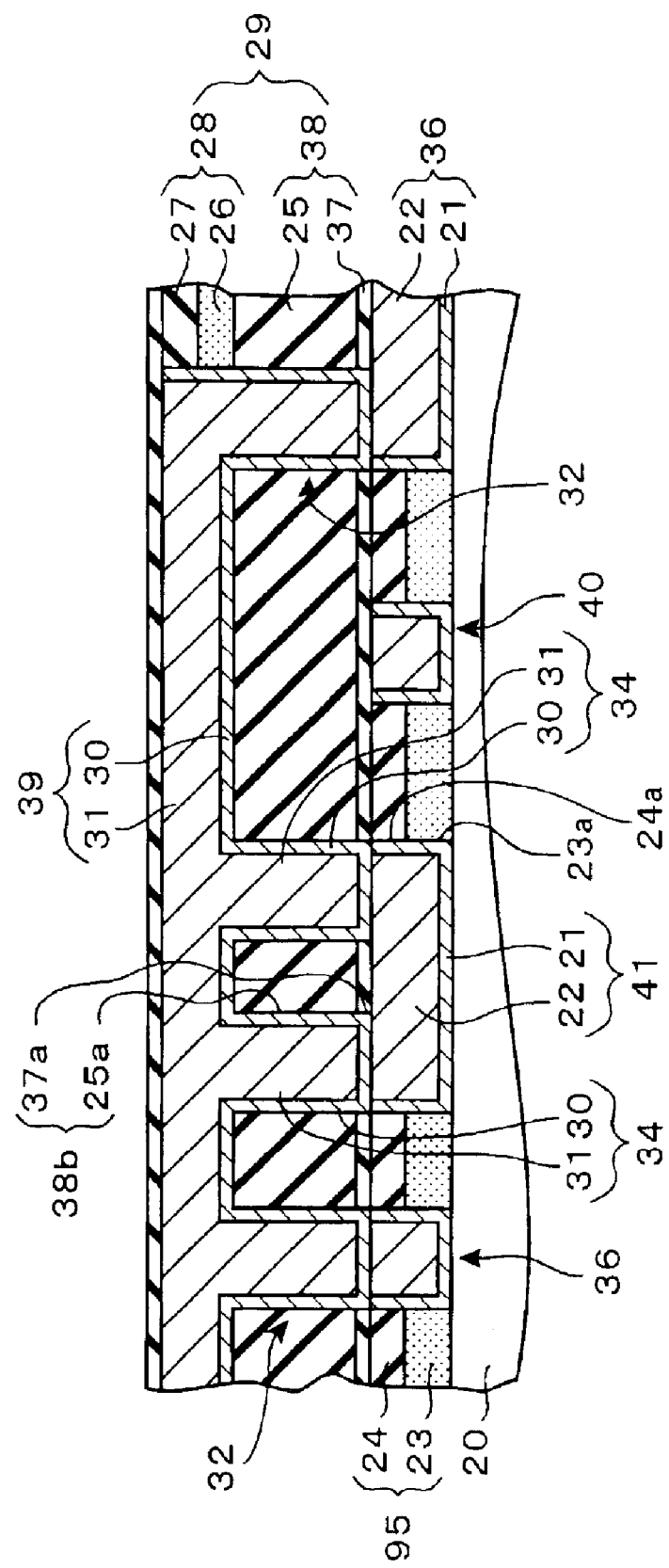
FIG. 3 is a sectional view showing a semiconductor device according to a second embodiment of the present invention.

FIG. 3 is a sectional view showing a semiconductor device according to a second embodiment of the present invention. In FIG. 3, the same reference numerals as those in FIG. 1 are affixed to the members explained in FIG. 1 and their explanation will be omitted hereunder.

In the second embodiment, as shown in FIG. 3, a dummy wiring 41 is provided in the non-forming region of the first wiring 36, and the dummy via hole 38b is formed to reach this dummy wiring 41. Then, the dummy plugs 34 are formed to connect to this dummy wiring 41. In this case, the non-forming region of the wiring is defined as the region where the wiring is not formed in the layer in which the wiring is formed. Like the first wiring 36, this dummy wiring 41 has the double-layered structure of the barrier metal layer 21 and the copper film 22.

According to this, because the second wiring 39 can be firmly supported by the dummy plugs 34 that uses the dummy wiring 41 as its foundation, the mechanical strength of the laminated body consisting of the second insulating film 29 and the second wiring 39 can be enhanced. Such advantage is particularly useful for the situation where the low-dielectric insulating film of SiLK, or the like is employed in place of the silicon oxide film 25 to lower the overall dielectric constant of the second insulating film 29. If the present embodiment is applied to this case, the reduction in the strength of the laminated body consisting of the low-dielectric insulating film and the second wiring 39 due to the weakness of the mechanical strength of the low-dielectric insulating film can be prevented.

Figure 4:
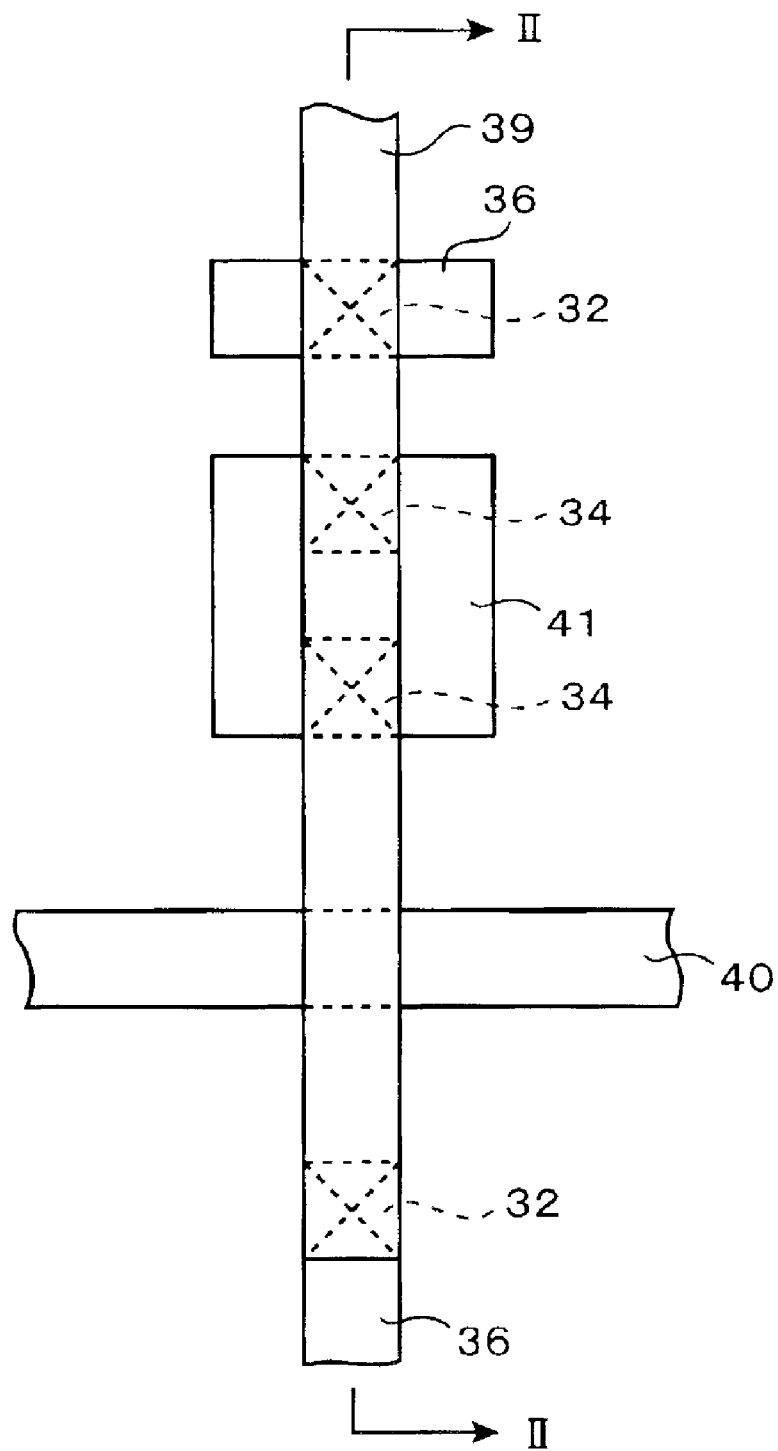
FIG. 4 is a plan view showing the semiconductor device according to the second embodiment of the present invention.

A planar arrangement of each plugs in the present embodiment is shown in FIG. 4. FIG. 4 is a plan view showing the semiconductor device according to the second embodiment. In FIG. 4, for easy understanding of the arrangement of each plugs, the underlying layer 20 (see FIG. 3) and each insulating films are omitted. Also, above FIG. 3 corresponds to a sectional view that is taken along a II—II line in FIG. 4.

(3) Third Embodiment

Figure 5A:
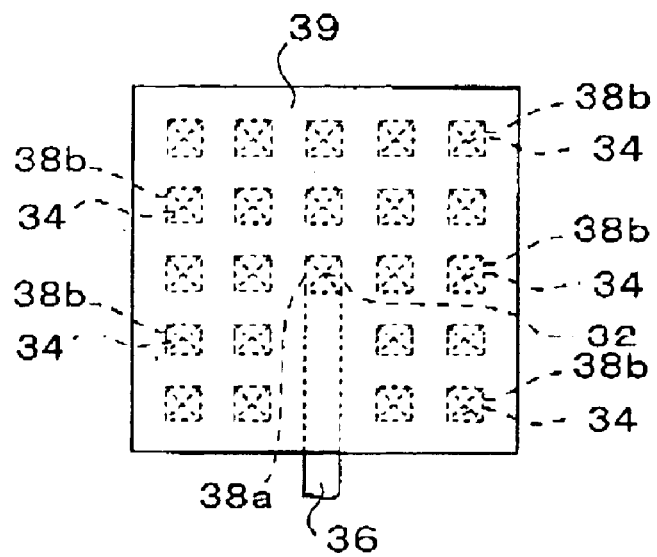
FIGS. 5A to 5C are plan views showing semiconductor devices according to a third embodiment of the present invention.
Figure 5B:
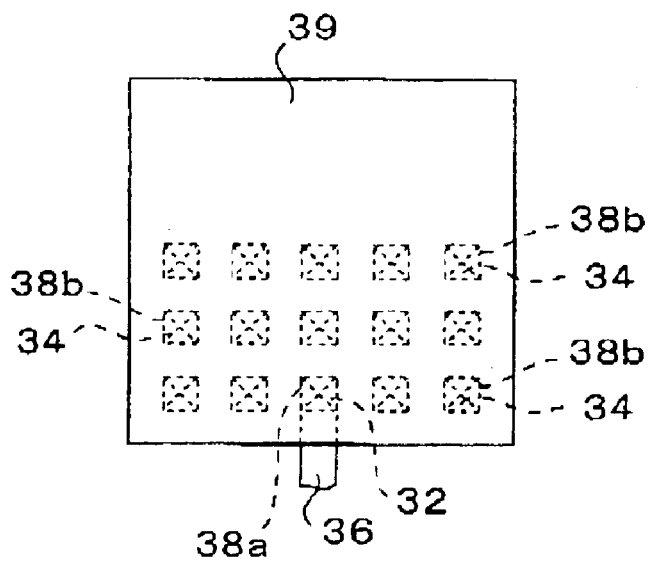
Figure 5C:
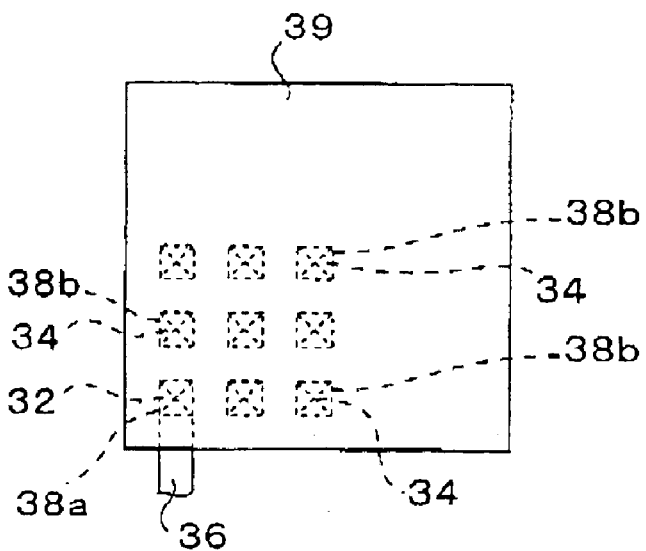

FIGS. 5A to 5C are plan views showing semiconductor devices according to a third embodiment of the present invention. In these figures, in order to make the planar arrangement of each plugs and the planar shape of the second wiring 39 easy to see, the underlying layer 20 (see FIGS. 1 and 3) and each insulating films are omitted.

In the first and second embodiments, as shown in FIG. 2 and FIG. 4, the planar shape of the second wiring 39 is a linear shape. However, the planar shape of the second wiring 39 is not limited to the linear shape. The planar shape may be of a solid shape, as shown in FIGS. 5A to 5C.

FIG. 5A shows an example in which the plug 32 is provided in vicinity of the center of the solid second wiring 39, and a plurality of dummy plugs 34 are provided around such plug 32.

FIG. 5B shows an example in which the plug 32 is provided to one edge portion of the solid second wiring 39 and a plurality of dummy plugs 34 are provided in vicinity of such one edge portion.

FIG. 5C shows an example in which the plug 32 is provided to one corner of the solid second wiring 39 and a plurality of dummy plugs 34 are provided in vicinity of such one corner.

All of the examples shown in FIGS. 5A to 5C can obtain the advantage similar to the first embodiment.

Next, results of simulations about the present embodiment made by the inventors of the present invention will be explained with reference to FIGS. 17A to 17C and FIG. 18 hereunder.

Figure 17A:
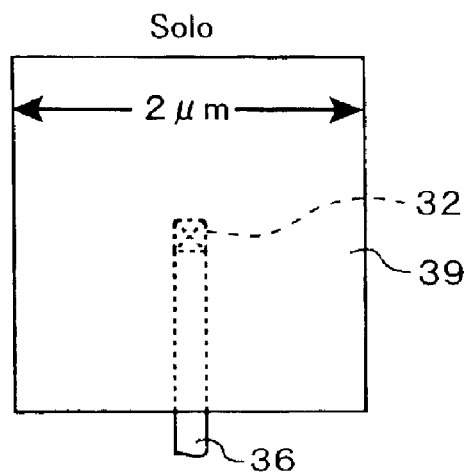
FIGS. 17A to 17C are plan views showing models used in simulations of the semiconductor device according to the third embodiment of the present invention.
Figure 17B:
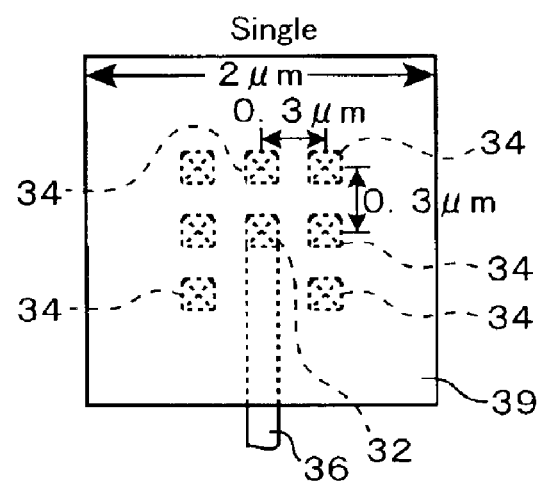
Figure 17C:
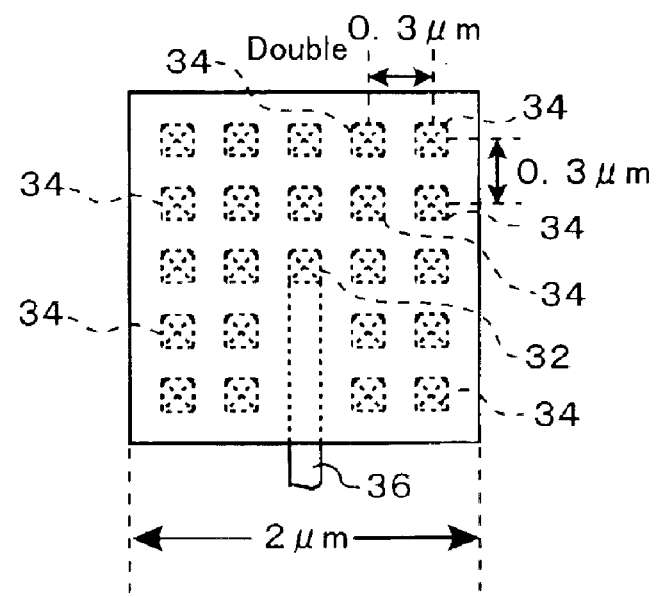

FIGS. 17A to 17C are plan views showing models used in the simulations of the semiconductor device.

FIG. 17A shows the case where the plug 32 is provided solely in the solid second wiring 39 without providing the dummy plug 34.

FIG. 17B shows the case where the dummy plugs 34 are provided in the second wiring 39 to singly surround the plug 32.

FIG. 17C shows the case where the dummy plugs 34 are provided in the second wiring 39 to doubly surround the plug 32.

In all the cases in FIGS. 17A to 17C, a circular cylinder whose diameter is 0.15 μm and whose height is 0.42 μm was employed as the model of the plug 32 and the dummy plug 34. Also, the width of the second wiring 39 was fixed to 2 μm. Then, the interval between the neighboring plugs (including the plug 32 and the dummy plug 34) was fixed to 0.3 μm.

Figure 18:
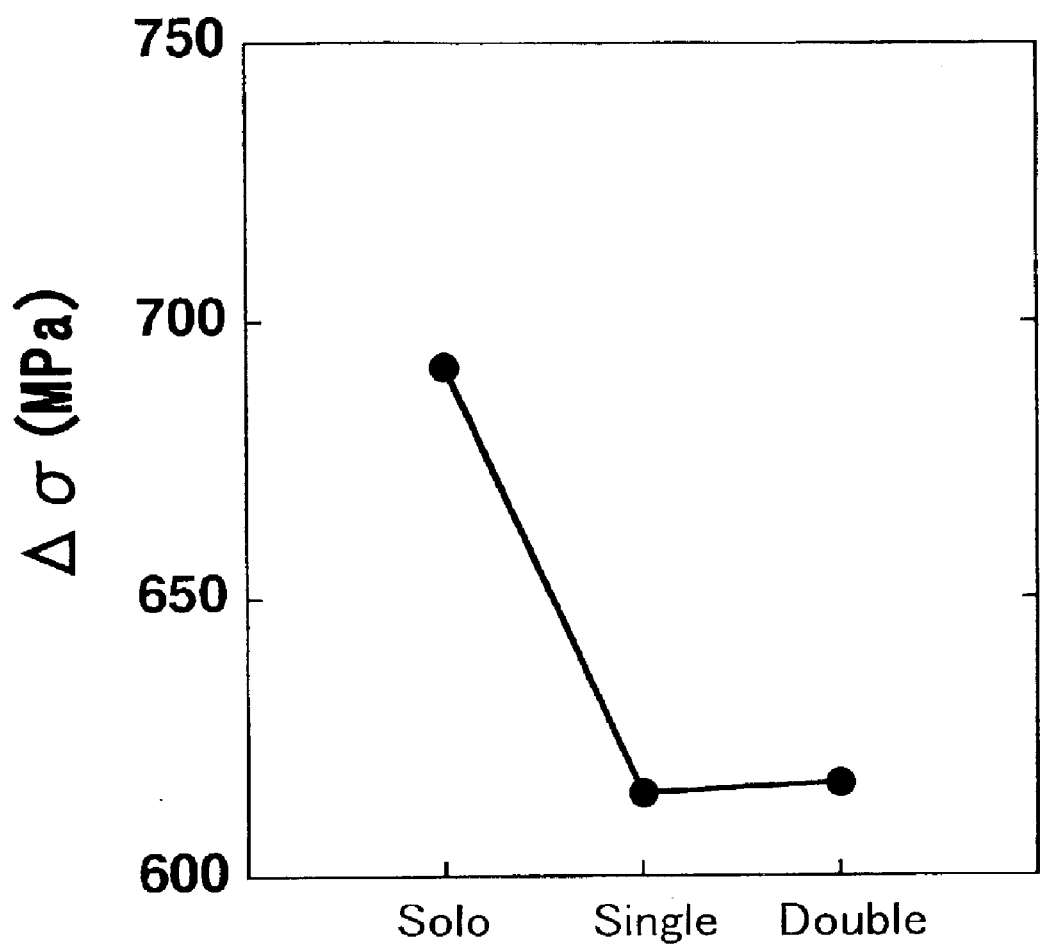
FIG. 18 is a graph showing simulation results of the semiconductor device according to the third embodiment of the present invention.
Figure 19:
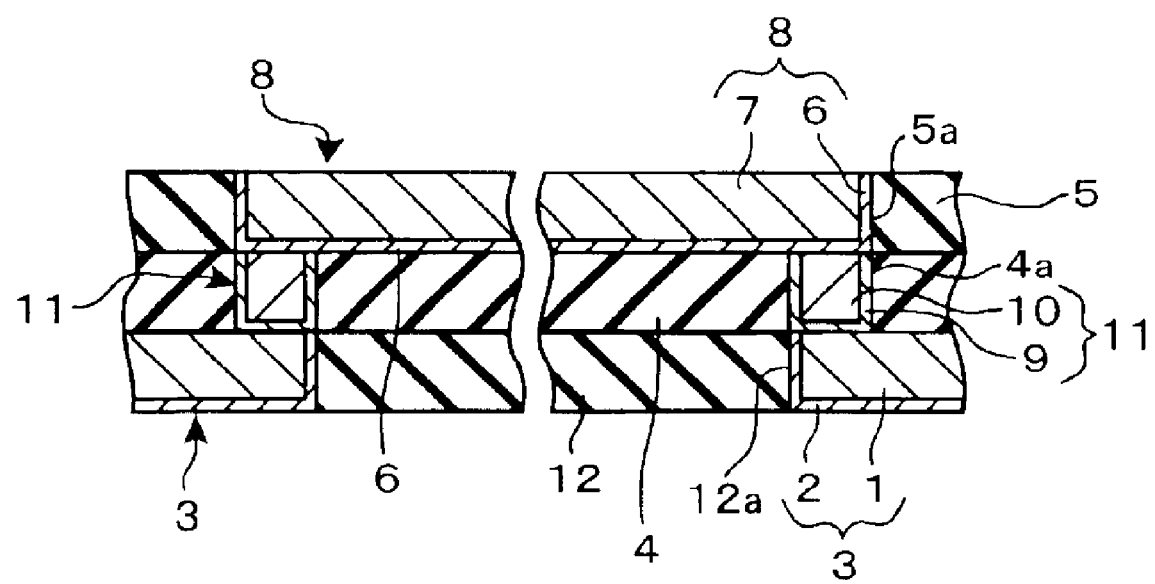
FIG. 19 is a sectional view showing the semiconductor device manufactured by the single damascene process in the prior art.
Figure 20:
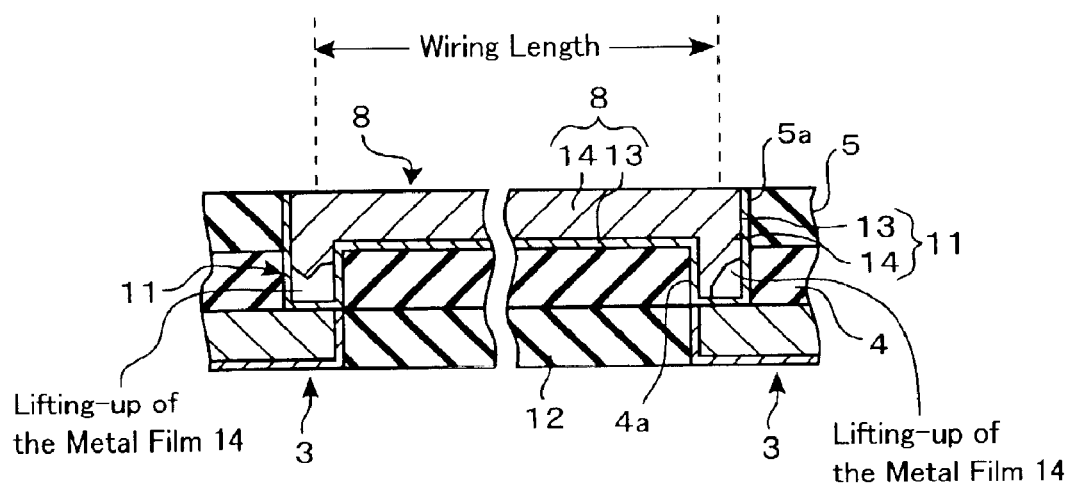
FIG. 20 is a sectional view showing the semiconductor device manufactured by the dual damascene process in the prior art.

Simulation results are shown in FIG. 18. In FIG. 18, the meaning of $\Delta\sigma$ on an ordinate is similar to that explained in FIGS. 15A and 15B, and is the difference of vertical components of the stress on the upper surface and the lower surface of the plug 32.

As can be seen from FIG. 18, where the plug 32 is solely provided (see FIG. 17A), the difference $\Delta\sigma$ is large and thus the stress-migration is ready to occur. In contrast, it is understood that where the plugs 34 are provided to surround singly or doubly the plug 32 (see FIG. 17B and FIG. 17C), the difference $\Delta\sigma$ decreases than the case where the plug 32 is provided solely, and thus the stress-migration is hard to occur.

As a result, even in the case where the wiring length of the second wiring 39 is not defined like the case where only one plug 32 is provided in the solid second wiring 39, the stress-migration can be reduced by providing a plurality of dummy plugs 34 around the plug 32. In other words, this means that, if a plurality of dummy via holes 38b are provided around the via hole 38a, the stress-migration can be reduced.

(4) Fourth Embodiment

Figure 6:
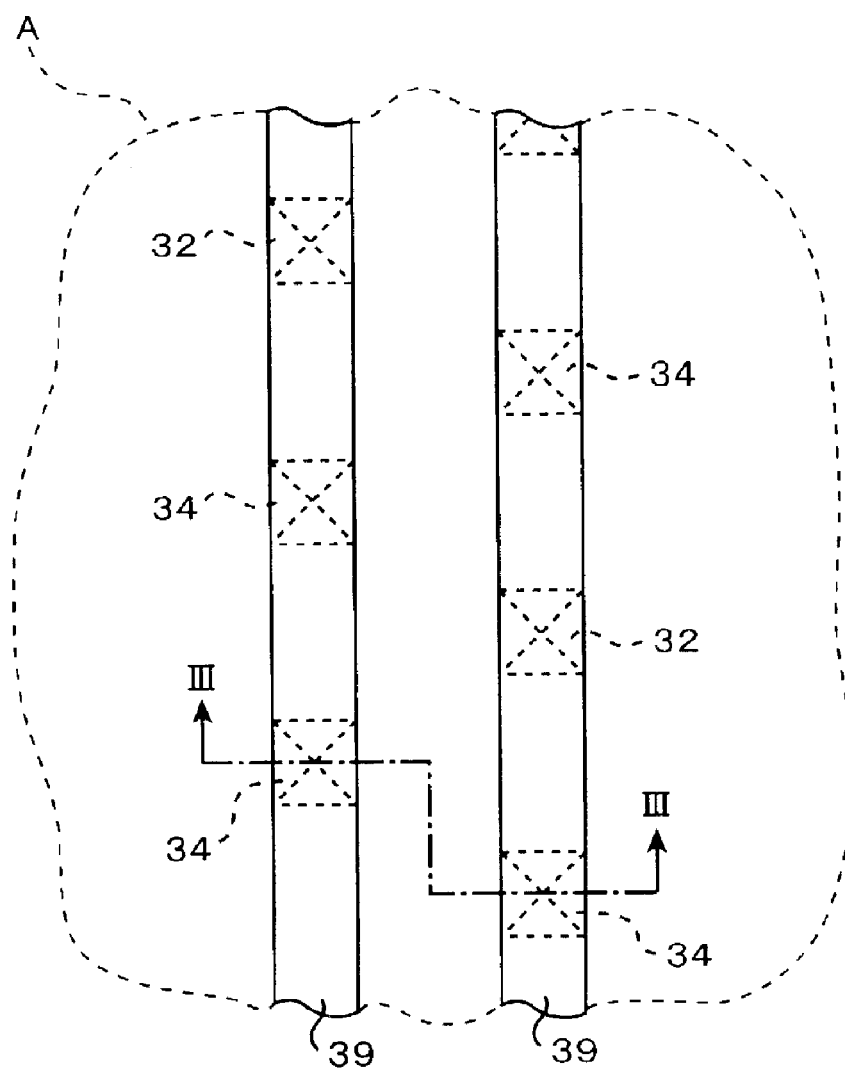
FIG. 6 is a plan view showing a semiconductor device according to a fourth embodiment of the present invention.
Figure 7:
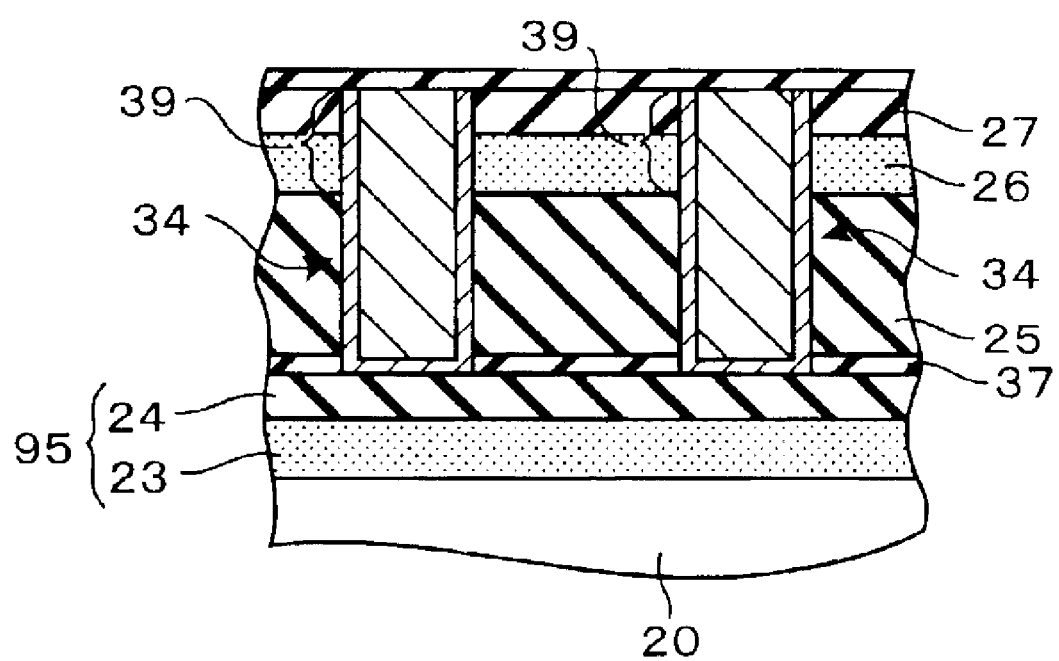
FIG. 7 is a sectional view taken along a III—III line in FIG. 6.

FIG. 6 is a plan view showing a semiconductor device according to a fourth embodiment of the present invention. In FIG. 6, in order to make the planar arrangement of the each plugs and the second wiring 39 easy to see, the underlying layer 20 (see FIGS. 1 and 3) and each insulating films are omitted. Also, FIG. 7 is a sectional view taken along a III—III line in FIG. 6. As described later, the present embodiment is suitable for increasing the operation speed of the semiconductor device.

As shown in FIG. 6, in the present embodiment, a plurality of second wirings 39 are arranged at an interval in one area A. Then, in the two neighboring second wirings 39, the dummy plug 34 in one second wiring 39 is not arranged next to the dummy plug 34 in the other second wiring 39 along the direction that is perpendicular to an extending direction of the second wiring 39. Here, the extending direction of the second wiring 39 means any one of extending directions of two adjacent second wirings.

According to this, because the dummy plugs 34 in the neighboring second wirings 39 are arranged not to oppose to each other, an opposing capacitance between the dummy plugs 34 can be reduced. Therefore, the increase in the inter-wiring capacitance between the second wirings 39 due to the opposing capacitance can be prevented.

In the above, the opposing capacitance between the dummy plugs 34 was considered. However, the above can be applied to the plugs 32. If the above is applied to the plugs 32, the opposing capacitance between the plugs 32 in the neighboring second wirings 39 can also be reduced. In addition, if the above is applied to the different type plugs (the plug 32 and the dummy plug 34), the opposing capacitance between the plug 32 and the dummy plug 34 can also be reduced.

The number of the plugs 32 and the dummy plugs 34 is not limited. If the above is applied to a part of the plugs 32 or a part of the dummy plugs 34 in the second wirings 39, the inter-wiring capacitance between the second wirings 39 can also be reduced.

(5) Fifth Embodiment

Figure 8:
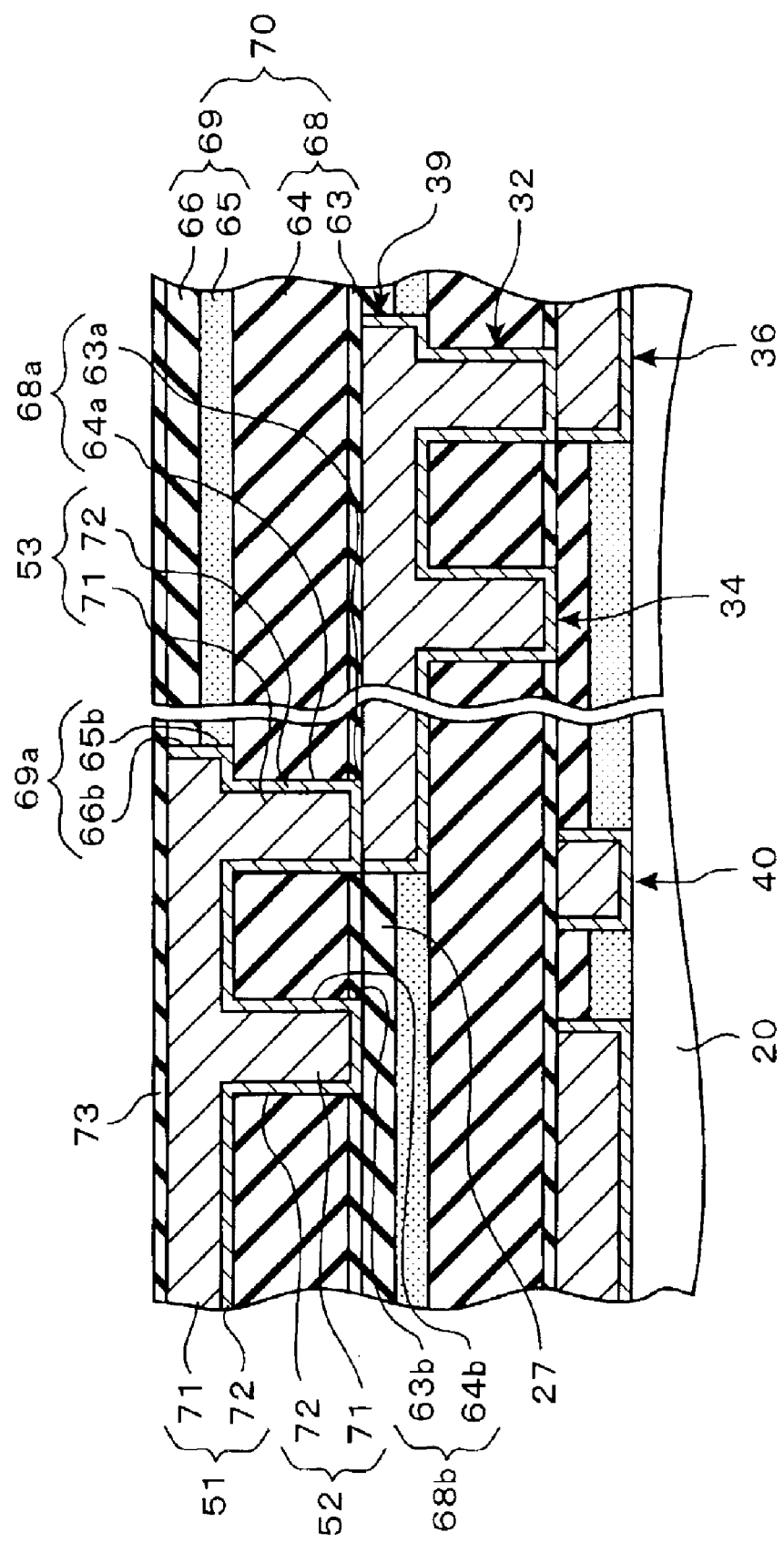
FIG. 8 is a sectional view showing a semiconductor device according to a fifth embodiment of the present invention.

FIG. 8 is a sectional view showing a semiconductor device according to a fifth embodiment of the present invention. In FIG. 8, reference numerals similar to those in the above are affixed to the members explained already in the above, and thus their explanation will be omitted hereunder.

In the first to fourth embodiments, the wirings are two layers of the first wiring 36 and the second wiring 39. However, the number of the wiring layers is not limited to two layers. In the present embodiment, as shown in FIG. 8, a third wiring 51 is provided above the second wiring 39, so that the number of the wiring layers is three layers.

This third wiring 51 has a double-layered structure consisting of a copper film 71 and a barrier metal layer 72 and is buried in a wiring trench 69a. Such wiring trench 69a is formed in an upper insulating film 69. This upper insulating film 69 is composed of a low-dielectric insulating film 65 (film thickness: about 250 nm) and a silicon oxide film 66 (film thickness: about 250 nm). As the low-dielectric insulating film 65, the material similar to the low-dielectric insulating films 23, 26 being already explained, such as SiLK, can be employed. The above wiring trench 69a is composed of openings 65b, 66b formed in the low-dielectric insulating film 65 and the silicon oxide film 66.

In FIG. 8, reference numeral 68 denotes a lower insulating film constituted of a silicon nitride film 63 (film thickness: about 50 nm) and a silicon oxide film 64 (film thickness: about 700 nm).

Reference numeral 68a denotes via hole (connection hole) and is formed in the lower insulating film 68 to reach the second wiring 39. Such via hole 68a is constructed by openings 63a, 64a formed in the silicon nitride film 63 and the silicon oxide film 64.

Reference numeral 68b denotes a dummy via hole (dummy connection hole) and is formed in the lower insulating film 68 to reach the non-forming region of the second wiring 39. Such dummy via hole 68b is constructed by openings 63b, 64b formed in the silicon nitride film 63 and the silicon oxide film 64.

The third wiring 51 is also buried in the via hole 68a and the dummy via hole 68b. In the following, the portion of the third wiring 51, which is buried in the via hole 68a, is called a plug 53 and the portion of the third wiring 51, which is buried in the dummy via hole 68b, is called a dummy plug 52.

A third insulating film 70 is constructed by the lower insulating film 68 and the upper insulating film 69. Here, the reference numeral 73 denotes a silicon nitride film that covers the third wiring 51.

Figure 9:
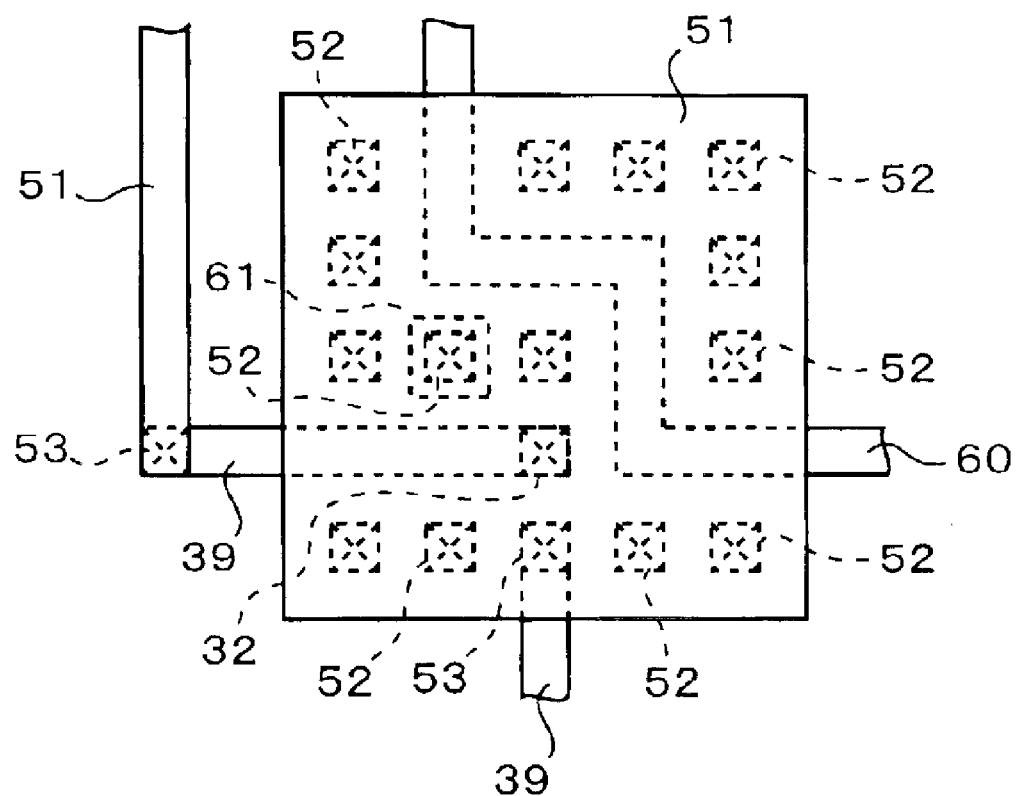
FIG. 9 is a plan view showing the semiconductor device according to the fifth embodiment of the present invention.

FIG. 9 is a plan view showing the semiconductor device according to the fifth embodiment of the present invention.

The planar shape of the third wiring 51 is not limited. The third wiring 51 may be formed like a line shape, or may be formed as a solid shape shown in FIG. 9.

In FIG. 9, reference numeral 60 denotes a different-potential wiring that has a different potential from those of the second wiring 39 and the third wiring 51, and is formed in the same layer as the second wiring 39. It is preferable that the dummy plug 52 in the third wiring 51 should be formed out of this different-potential wiring 60. This is because, if the dummy plug 52 is connected to the different-potential wiring 60, the second wiring 39 and the different-potential wiring 60 are connected electrically and thus the circuit cannot desirably function.

Then, reference numeral 61 denotes a dummy wiring formed in the same layer as the second wiring 39. The dummy plug 52 may be connected to this dummy wiring 61. If they are connected in this manner, the mechanical strength of the laminated body consisting of the silicon oxide film 64 (see FIG. 8) and the third wiring 51 can be enhanced by the same reason as the second embodiment.

Figure 10:
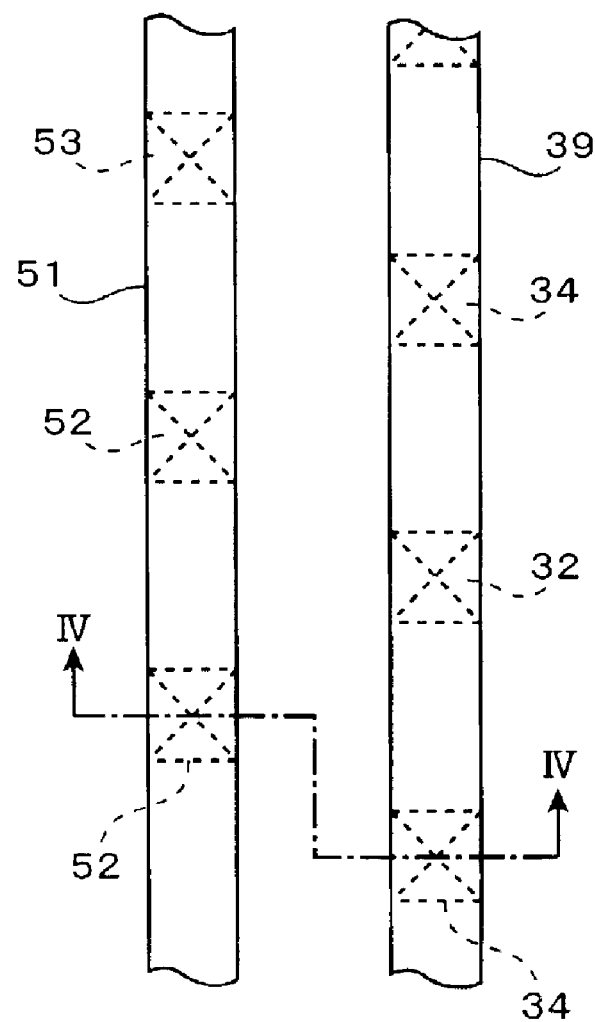
FIG. 10 is a plan view showing another semiconductor device according to the fifth embodiment of the present invention.
Figure 11:
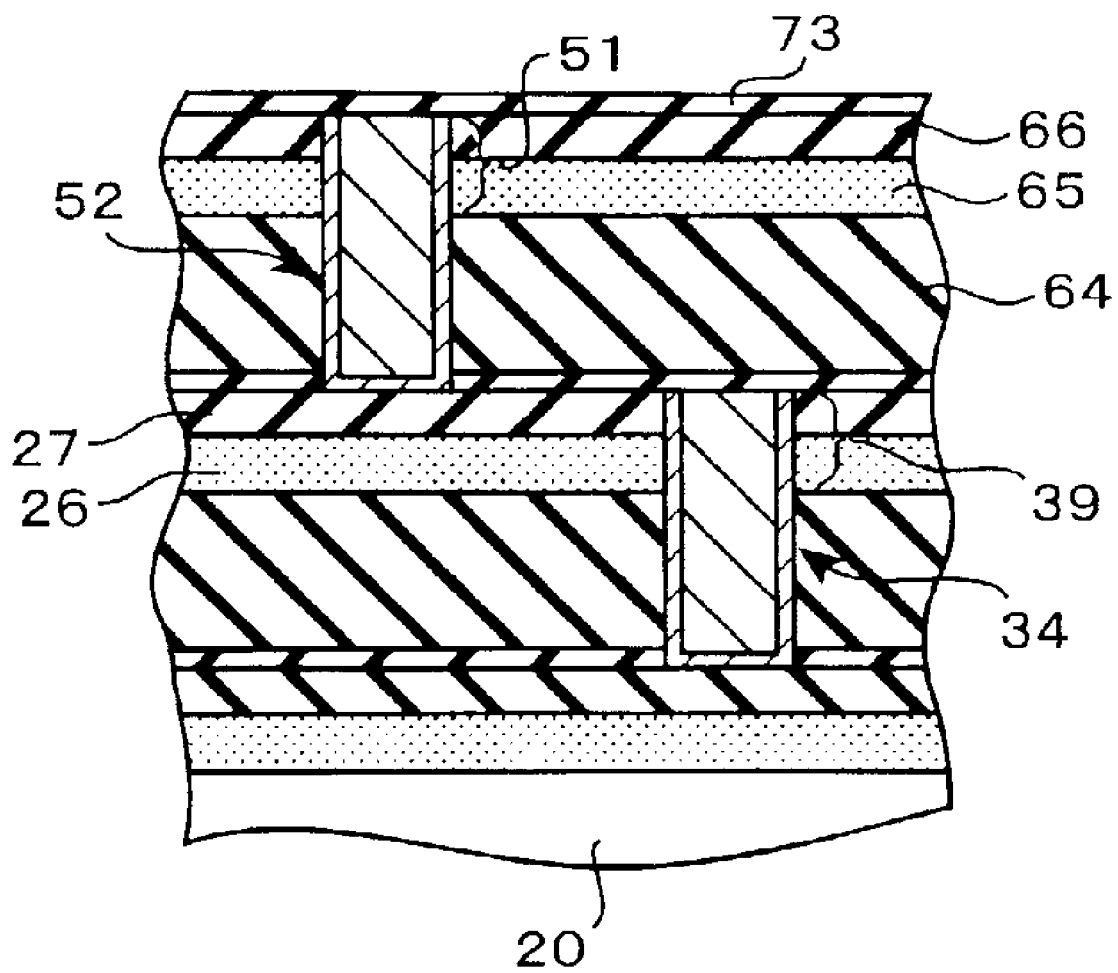
FIG. 11 is a sectional view taken along a IV—IV line in FIG. 10.

FIG. 10 is a plan view showing another semiconductor device according to the fifth embodiment of the present invention. FIG. 11 is a sectional view taken along a IV—IV line in FIG. 10.

In the fourth embodiment, the reduction in the inter-wiring capacitance in the same layer (i.e., the capacitance between the second wirings 39) was explained. It is preferable that the inter-wiring capacitance is reduced, not only in the same layer, but also in the different layers.

In the fifth embodiment, in order to reduce the inter-wiring capacitance between the different layers, each plugs are arranged as shown in FIG. 10. According to such arrangement, if viewed from the upper side of the third wiring 51, the dummy plug 34 in the second wiring 39 and the dummy plug 52 in the third wiring 51 are not arranged adjacently in the direction that is perpendicular to the extending direction of the second wiring 39. The same argument holds when considering the extending direction of the third wiring 51 , instead of the extending direction of the second wiring 39.

According to this, because the dummy plug 34 in the second wiring 39 is not arranged next to the dummy plug 52 in the third wiring 51, the opposing capacitance between the dummy plugs 34, 52 can be reduced. Therefore, increasing in the inter-wiring capacitance between the second wiring 39 and the third wiring 51 due to the opposing capacitance of the plugs can be prevented.

In the above, the opposing capacitance between the dummy plugs 34, 52 was argued. However, by applying this argument to the plugs 32, 53, the opposing capacitance between these plugs 32, 53 can be reduced. In addition, by applying this argument to the different-type plugs (the plug 32 and the dummy plug 52, or the plug 53 and the dummy plug 34), the opposing capacitance between these plugs can also be reduced.

The number of the plugs 32, 53 and the dummy plugs 34, 52 as the objects for obtaining the above advantage is not limited. If the above is applied to a part of the plugs 32, 51 or a part of the dummy plugs 34, 52 in the second wirings 39 and the third wiring 51, the inter-wiring capacitance between the second wiring 39 and the third wiring 51 can also be reduced.

(6) Explanation of the Manufacturing Method

Figure 12A:
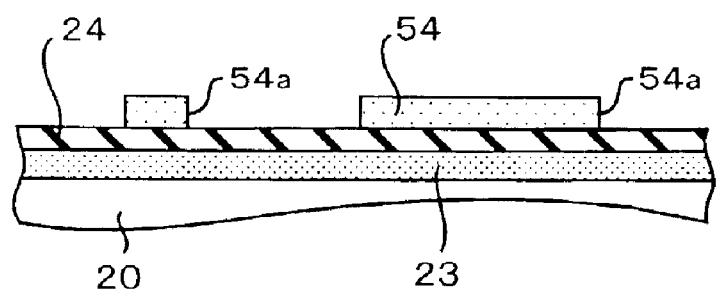
FIGS. 12A to 12N are sectional views showing a method of manufacturing the semiconductor device according to the embodiments of the present invention.

Next, a method of manufacturing the above semiconductor device will be explained with reference to FIGS. 12A to 12N hereunder. FIGS. 12A to 12N are sectional views showing the method of manufacturing the semiconductor device according to the embodiments of the present invention. This manufacturing method is the so-called dual damascene process in which the wirings and the plugs are formed integrally.

First of all, as shown in FIG. 12A, the low-dielectric insulating film 23 (film thickness: about 250 μm) is formed on the underlying layer 20. This underlying layer 20 has a structure in which, for example, the MOSFET is formed in the active region of the silicon wafer (semiconductor substrate), then the insulating film is formed on the surface of the wafer, and then the conductive plug is buried in this insulating film.

SiLK can be employed as the low-dielectric insulating film 23. SiLK is coated by the spin coating and cured by the annealing process at 400° C. for 30 minutes.

Then, the silicon oxide film 24 (film thickness: about 250 nm) is formed on this low-dielectric insulating film 23. In order to form the silicon oxide film 24, for example, the well-known plasma enhanced CVD (plasma Enhanced Chemical Vapor Deposition) method is employed.

Then, a photoresist layer 54 is formed on this silicon oxide film 24. Openings 54a each having a wiring pattern shape are formed in the photoresist layer 54 by the photolithography.

Figure 12B:
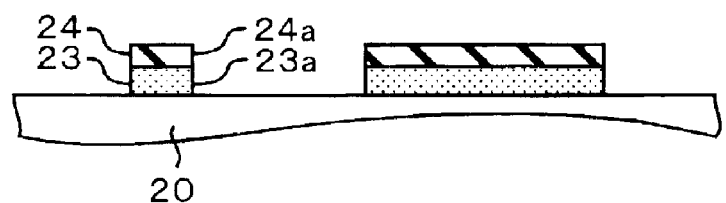

Then, as shown in FIG. 12B, the silicon oxide film 24 is etched by using the photoresist layer 54 as an etching mask. The openings 54a are transferred onto the silicon oxide film 24 by this etching and thus openings 24a are formed in the silicon oxide film 24. Also, this etching is executed by RIE (Reactive Ion Etching) and the CF etching gas is used.

Then, the low-dielectric insulating film 23 is etched by using the silicon oxide film 24 as an etching mask. The openings 24a are transferred to the low-dielectric insulating film 23 by this etching and thus openings 23a are formed in the low-dielectric insulating film 23. As the etching gas used in this etching, the plasmanized gas mixture consisting of $H_2$ and $NH_3$ is employed. Against this etching gas, the photoresist layer 54 has an etching rate that is substantially the same level to that of the low-dielectric insulating film 23. Therefore, the photoresist layer 54 is removed at the same time when the low-dielectric insulating film 23 is etched.

Figure 12C:
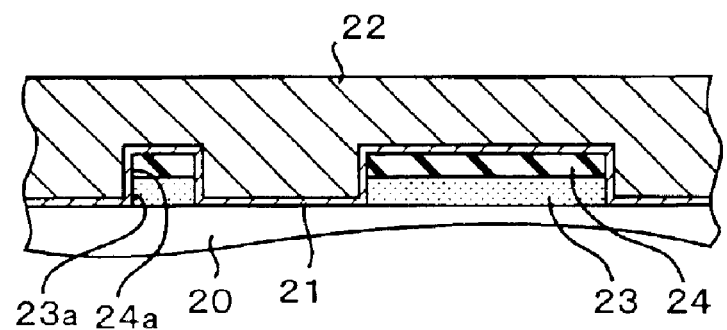

Then, as shown in FIG. 12C, the barrier metal layer 21 (film thickness: about 50 nm) is formed on the overall exposed surface. Such barrier metal layer 21 is made of the refractory metal such as Ta (tantalum), etc., for example, and is formed by the sputtering, or the like.

Then, the copper film 22 is formed on this barrier metal layer 21. The copper film 22 is formed by the sputtering and has a film thickness (about 1500 nm) that can fill the openings 23a, 24a completely. The method of forming the copper film 22 is not limited. In place of the above, a thin copper seed layer may be formed on the barrier metal layer 21 and then the copper film 22 may be formed by the electrolytic plating while using this seed layer as the power supply layer.

Figure 12D:
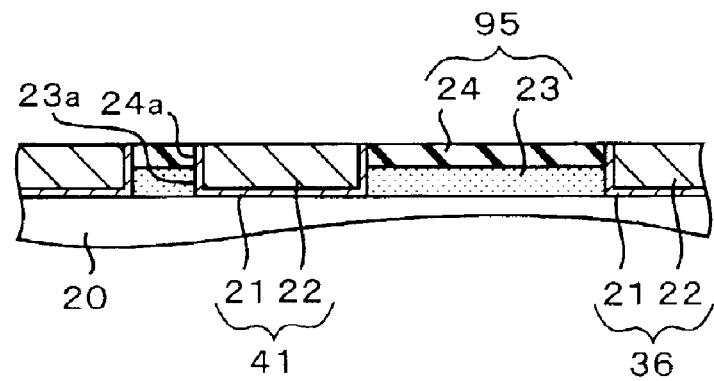

Then, as shown in FIG. 12D, along with planarizing a surface of the copper film 22, the unnecessary copper film 22 and the unnecessary barrier metal layer 21 on the silicon oxide film 24 are removed by the CMP (Chemical Mechanical Polishing) method. Thus, the copper film 22 and the barrier metal layer 21 remain only in the openings 23a, 24a. The residual copper film 22 and the barrier metal layer 21 constitute the first wiring 36 and the dummy wiring 41. A substantially flat surface on which surfaces of the first wiring 36 and a first insulating film 95 are each continued can be obtained by this CMP.

Figure 13:
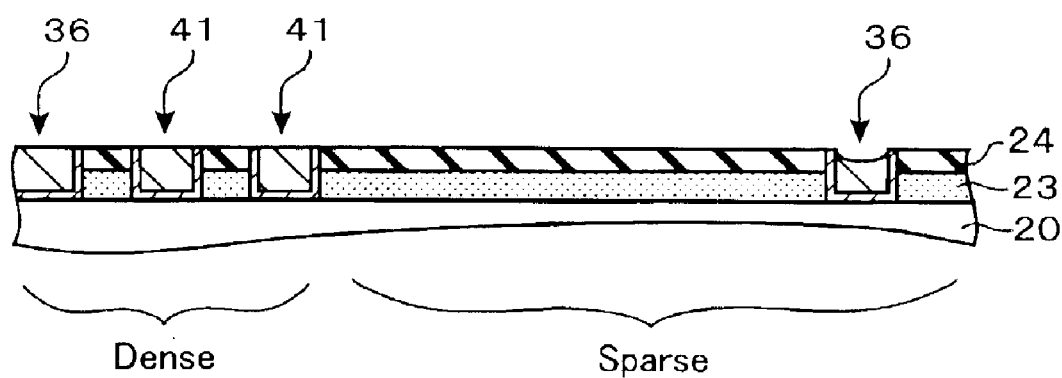
FIG. 13 is a sectional view showing the disadvantage caused when an extreme difference in the wiring density is present, in the method of manufacturing the semiconductor device according to the embodiments of the present invention.

By the way, in order to execute the above CMP preferably, it is preferable that a total wiring occupation ratio, incorporating both the first wiring 36 and the dummy wiring 41, is substantially constant in the plane. In the present specification, the "wiring occupation ratio" is defined as a value (B/A) that is given by setting a virtual region (whose shape is not limited) of an arbitrary area A in the wiring layer and then dividing a total area B of the wirings in this virtual region by the area A If the wiring density varies extremely as in FIG. 13, the wiring occupation ratio cannot be said as constant in the plane because this ratio largely differs between the dense wiring portion and the sparse wiring portion. In this case, because the CMP slurry disperses onto the first wiring 36 and the dummy wiring 41 in the dense wiring portion, a polishing amount becomes small and thus a height of the polished wirings becomes high in the dense portion. In contrast, because the CMP slurry concentrates to the first wiring 36 in the sparse wiring portion, a polishing amount becomes large and thus a height of the polished wirings becomes low in the sparse portion.

In this manner, when the wiring occupation ratio is not constant in the plane, the variation in the height of the wirings is brought about and thus it is difficult to control the height of the wirings.

On the contrary, as shown in FIG. 12D, if the wiring occupation ratio is substantially constant, the CMP slurry can disperse uniformly to the first wiring 36 and the dummy wiring 41. Therefore, a polishing amount does not vary in the plane and thus the height of the wirings can be controlled easily.

Figure 12E:
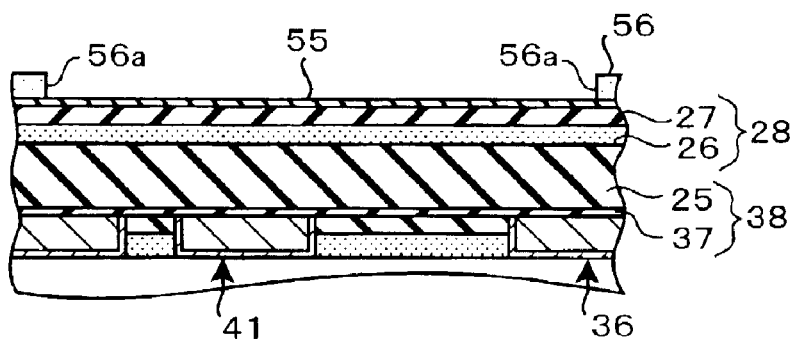

After the CMP is executed as above, steps shown in FIG. 12E are carried out. In these steps, the silicon nitride film 37 (film thickness: about 50 nm) is formed to cover the first wiring 36 and the dummy wiring 41. This silicon nitride film 37 is formed by the well-known plasma enhanced CVD method, for example.

Then, the silicon oxide film 25 (film thickness: about 1200 nm) is formed on the silicon nitride film 37. The silicon oxide film 25 is also formed by the well-known plasma enhanced CVD method, and then a surface of the silicon oxide film 25 is planarized by the CMP method. A residual thickness of the silicon oxide film 25 becomes about 700 nm by this CMP. The lower insulating film 38 is constructed by the silicon nitride film 37 and the remaining silicon oxide film 25.

Then, the low-dielectric insulating film 26 (film thickness: about 250 nm), the silicon oxide film 27 (film thickness: about 250 nm), and a metal film 55 are laminated on the silicon oxide film 25. The upper insulating film 28 is constructed by the low-dielectric insulating film 26 and the silicon oxide film 27.

As the low-dielectric insulating film 26, SiLK, or the like can be employed. Also, the silicon oxide film 27 is formed by the well-known plasma enhanced CVD method. The metal film 55 is made of TiN, or the like, for example, and is formed by the sputtering, etc. A film which has the high selective etching ratio to the silicon oxide film, such as the silicon nitride film, may be employed instead of the metal film 55.

Then, after the formation of the metal film 55, a photoresist layer 56 is formed thereon. An opening 56a having the wiring pattern shape is opened in the photoresist layer 56 by the photolithography.

Figure 12F:
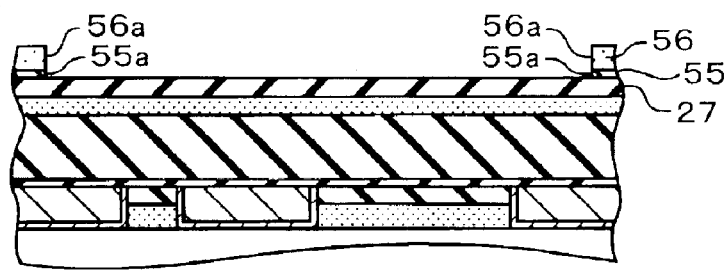

Then, as shown in FIG. 12F, the metal film 55 is etched by using the photoresist layer 56 as an etching mask. Thus, the opening 56a is transferred onto the metal film 55 and thus an opening 55a is formed in the metal film 55. This etching is executed by RIE and the Cl containing etching gas is employed. After this etching is completed, the photoresist layer 56 is removed by the ashing using the $O_2$ plasma.

Figure 12G:
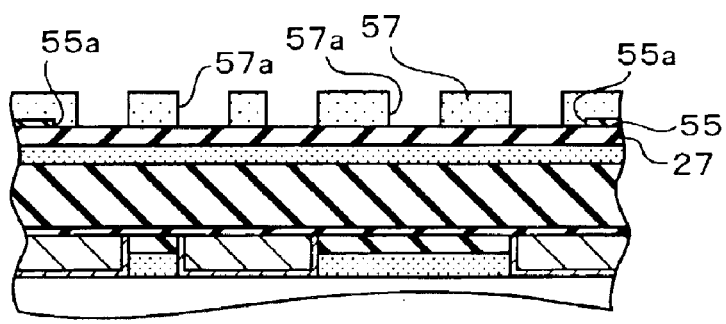

Then, as shown in FIG. 12G, a new photoresist layer 57 is formed. The forming areas of the photoresist layer 57 are on the metal film 55 and on the silicon oxide film 27 exposed from the opening 55a. Openings 57a having the via pattern shape are formed in the photoresist layer 57 by the photolithography.

Figure 12H:
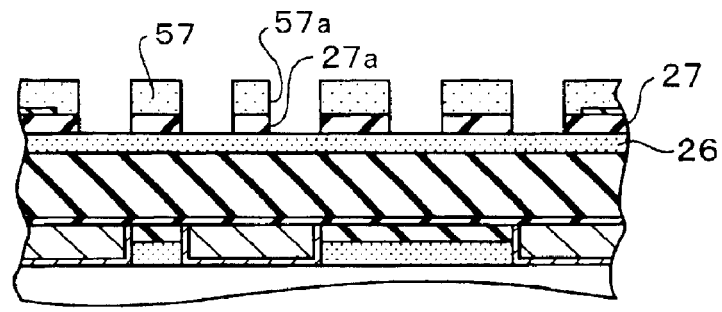

Then, as shown in FIG. 12H, the silicon oxide film 27 is etched by using the photoresist layer 57 as an etching mask. Such etching is executed by RIE and the CF containing etching gas is employed. Because the low-dielectric insulating film 26 has the etching resistance against this etching gas, this etching is stopped on the surface of the low-dielectric insulating film 26. Thus, the openings 57a in the photoresist layer 57 are transferred onto the silicon oxide film 27 by this etching, and thus the openings 27a are formed in the silicon oxide film 27.

Figure 12I:
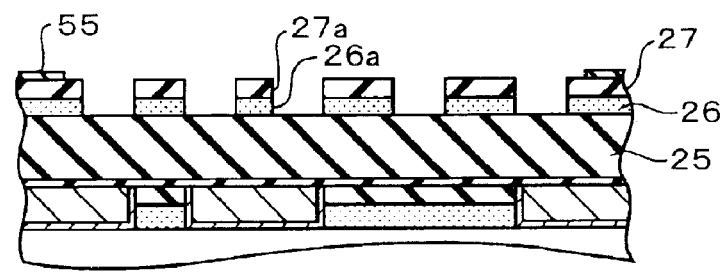

Then, as shown in FIG. 12I, the low-dielectric insulating film 26 is etched by using the silicon oxide film 27 as an etching mask. Thus, the openings 27a are transferred onto the low-dielectric insulating film 26 and thus the openings 26a are formed in the low-dielectric insulating film 26. This etching is executed by RIE using the gas mixture consisting of $H_2$ and $NH_3$ as an etching gas.

Against this etching gas, the photoresist layer 57 (see FIG. 12H) has the etching rate that is substantially the same level to that of the low-dielectric insulating film 26. Therefore, the photoresist layer 57 is removed simultaneously when the low-dielectric insulating film 26 is etched.

Figure 12J:
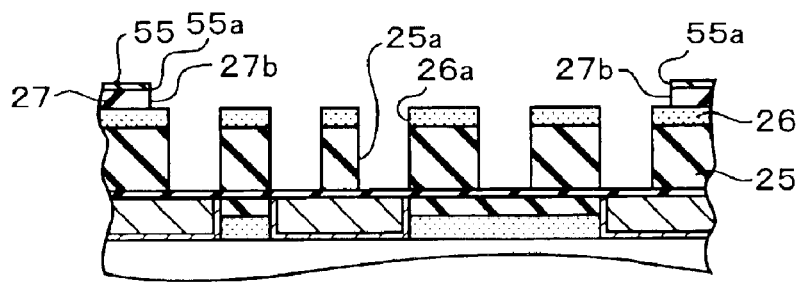

Then, as shown in FIG. 12J, the silicon oxide film 27 is etched by using the metal film 55 as an etching mask. Thus, the openings 55a are transferred onto the silicon oxide film 27 and thus the openings 27b are formed in the silicon oxide film 27. This etching is executed by RIE using the CF containing etching gas.

At this time, the silicon oxide film 25 that is exposed from the openings 26a in the low-dielectric insulating film 26 is etched simultaneously. Thus, the openings 26a are transferred onto the silicon oxide film 25 and the openings 25a are formed in the silicon oxide film 25.

Figure 12K:
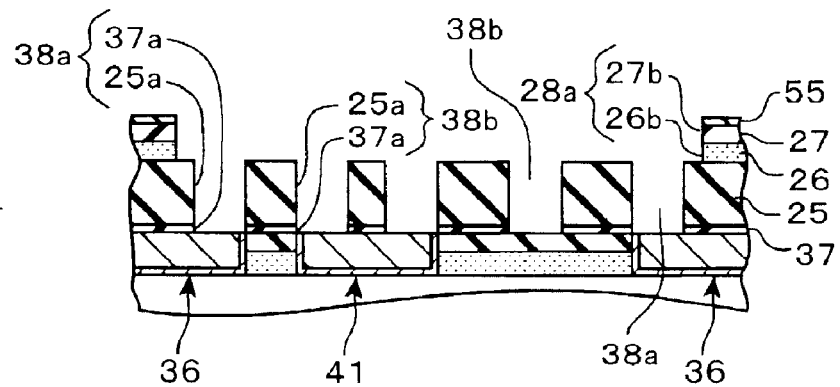

Then, as shown in FIG. 12K, the low-dielectric insulating film 26 is etched by using the silicon oxide film 27 as an etching mask. Thus, the openings 27b in the silicon oxide film 27 are transferred onto the low-dielectric insulating film 26 and thus the openings 26b are formed in the low-dielectric insulating film 26. Such etching is executed by RIE using the gas mixture consisting of $H_2$ and $NH_3$ as an etching gas.

Then, the silicon nitride film 37 is etched by using the silicon oxide film 25 as an etching gas. The openings 25a in the silicon oxide film 25 are transferred onto the silicon nitride film 37 and thus the openings 37a are formed in the silicon nitride film 37.

In this case, each of the low-dielectric insulating film 26 and the silicon nitride film 37 may be etched, either prior or subsequent to the other.

Up to this step, formations of the via holes 38a, the dummy via holes 38b, and the wiring trench 28a are completed. The wiring trench 28a is constructed by the openings 27b and 26b. While, the via hole 38a and the dummy via hole 38b are each constructed by the openings 25a and 37a.

The via holes 38a are formed to extend from the wiring trench 28a to the first wiring 36. Then, the dummy via holes 38b may be formed to reach the nonforming region of the first wiring 36 or reach the dummy wiring 41.

Figure 12L:
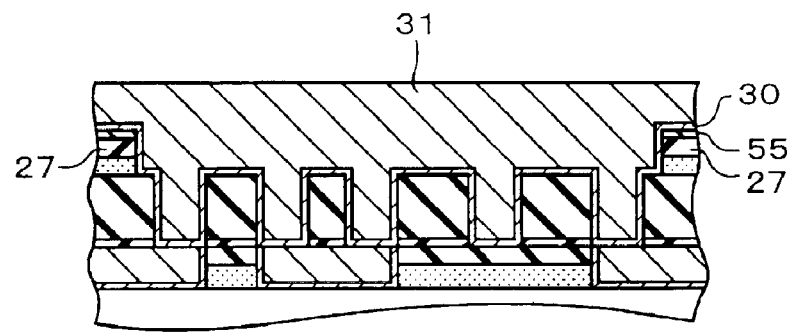

Then, as shown in FIG. 12L, the barrier metal layer 30 is formed. The forming areas of the barrier metal layer 30 are on the metal film 55, inner walls of the wiring trench 28a, inner walls (including bottom surfaces) of the via holes 38a, and inner walls (including bottom surfaces) of the dummy via holes 38b. The barrier metal layer 30 is made of the refractory metal such as Ta (tantalum), for example, and is formed by the sputtering, etc.

Then, the copper film 31 (film thickness: about 1500 nm) is formed on the barrier metal layer 30 by the sputtering. The method of forming the copper film 31 is not limited to this. For example, a thin copper seed layer may be formed on the barrier metal layer 30 and then the copper film 31 may be formed by the electrolytic plating while using this seed layer as the power supply layer.

Figure 12M:
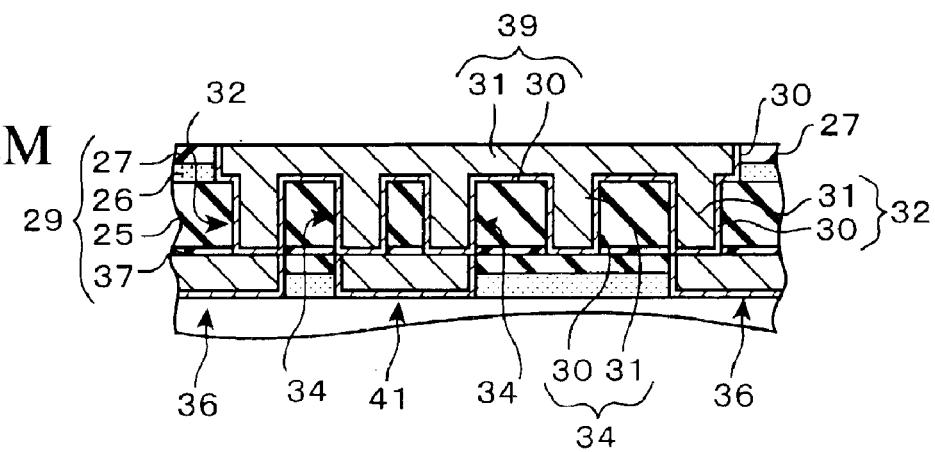
Figure 12N:
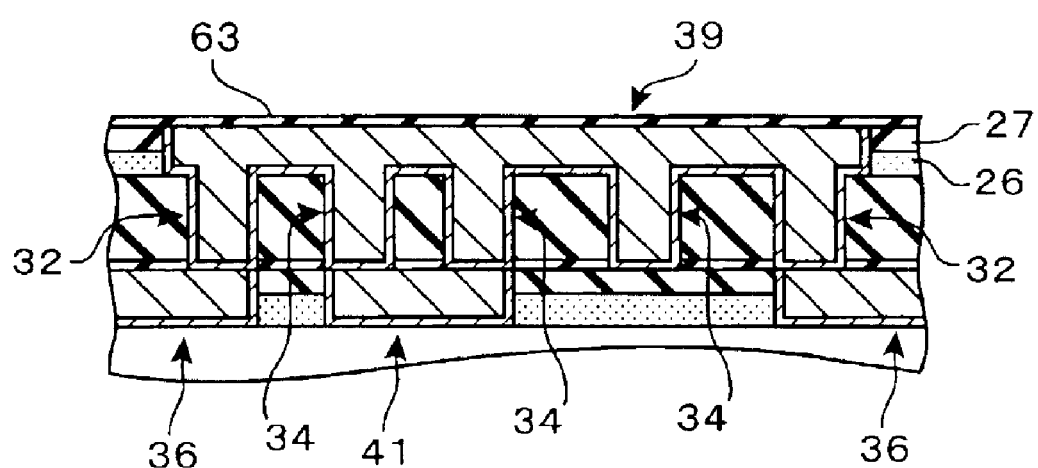

Then, as shown in FIG. 12M, the copper film 31, the barrier metal layer 30, and the metal film 55, which are each formed higher than the silicon oxide film 27, are polished by the CMP method to be removed. The barrier metal layer 30 and the copper film 31, which are not polished and left behind, constitute the second wiring 39. Then, the portion of the second wiring 39, which is buried in the via hole 38a, is served as the plug, and the portion of the second wiring 39, which is buried in the dummy via hole 38b, is served as the dummy plug. Also, the substantially flat surface on which surfaces of the second wiring 39 and the second insulating film 29 are each continued can be obtained by this CMP.

Then, as shown in FIG. 12N, the silicon nitride film 63 is formed on the second wiring 39. This silicon nitride film 63 is formed by the well-known plasma enhanced CVD method.

According to the above, the semiconductor device according to the embodiment of the present invention is completed.

Although the structure of two wiring layers (the first wiring 36 and the second wiring 39) is obtained in the above, any number of wirings can be laminated by repeating the method same to described above. The case where four layers are laminated will be explained in the following.

Figure 14:
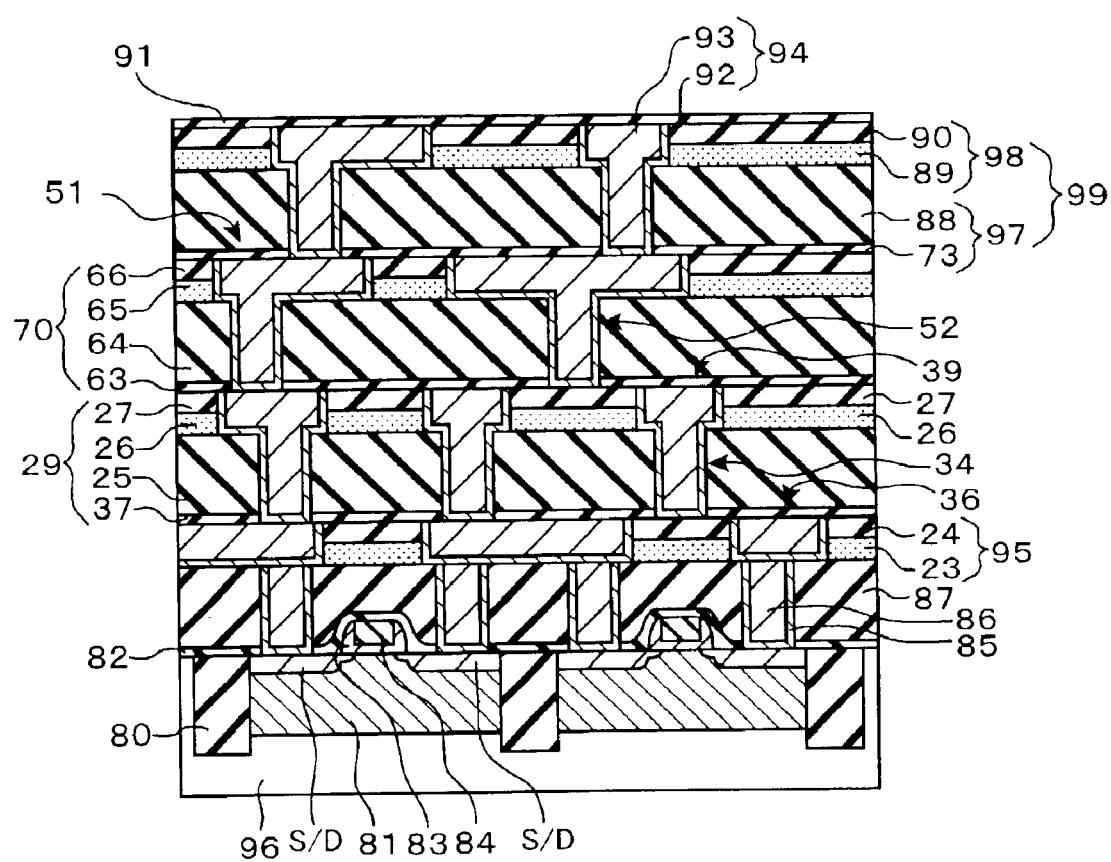
FIG. 14 is a sectional view showing the case where four layers of wirings are formed, in the method of manufacturing the semiconductor device according to the embodiments of the present invention.

FIG. 14 is a sectional view showing the case where the four wirings layers are laminated. In this example, the device isolation trench is formed in a predetermined region of a silicon substrate 96. Then, the insulator such as the silicon oxide is buried in the device isolation trench, whereby device isolation insulating regions 80 of the shallow trench isolation (STI) are formed.

Then, gate electrodes 84 and sidewall spacers 83 are formed on active regions of wells 81 that are defined by the device isolation insulating regions 80, and then source/drain regions S/D are formed by the ion-implantation on both sides of the gate electrodes 84. An etching stopper film 82 is formed to cover the insulating gate electrodes 84, and then an interlayer insulating film 87 is formed thereon. Conductive plugs, constituted of a barrier metal layer 85 and a metal film 86, are formed to pass through the interlayer insulating film 87 and the etching stopper film 82. The underlying layer 20 in the present embodiment and each embodiments of the present invention is constructed by above members, for example.

Then, a first insulating film 95 is formed on the interlayer insulating film 87 by the method described above, and then the first wirings 36 are buried in the first insulating film 95.

Then, the second insulating film 29 is formed on the first wiring 36 by the method described above, and the second wirings 39 are buried in the second insulating film 29. As described above, the substantially flat surface, on which surfaces of the second wirings 39 and the second insulating film 29 are each continued, can be obtained after the second wirings 39 are buried.

The silicon nitride film 63 and the silicon oxide film 64 are formed on the second wirings 39. Then, the surface of the silicon oxide film 64 is polished by the CMP to planarize.

Then, the low-dielectric insulating film 65 and the silicon oxide film 66 are formed on the silicon oxide film 64. As the low-dielectric insulating film 65, SiLK, or the like can be employed. The silicon oxide film 66 is formed by the well-known plasma enhanced CVD method. The silicon nitride film 63, the silicon oxide film 64, the low-dielectric insulating film 65, and the silicon oxide film 66 constitute the third insulating film 70.

Next, the third wirings 51 are buried in the third insulating film 70 by the method similar to that used to bury the second wirings 39 in the second insulating film 29, which is already described. Because the CMP is executed after the second wirings 39 are buried, the substantially flat surface on which surfaces of the third wirings 51 and the third insulating film 70 are each continued can be obtained.

Then, a silicon nitride film 73 and a silicon oxide film 88 are laminated on the third insulating film 70. These films are formed by the well-known plasma enhanced CVD method. Then, a surface of the silicon oxide film 88 is polished by executing the CMP and is planarized. A lower insulating film 97 is constituted of the silicon nitride film 73 and the silicon oxide film 88.

Next, a low-dielectric insulating film 89 and a silicon oxide film 90 are laminated on the lower insulating film 97. As the low-dielectric insulating film 89, SiLK, or the like can be employed. Then, the silicon oxide film 90 is formed by the well-known plasma enhanced CVD method. An upper insulating film 98 is constituted of the low-dielectric insulating film 89 and the silicon oxide film 90. Also, a fourth insulating film 99 is constructed by the upper insulating film 98 and the lower insulating film 97.

Then, fourth wirings 94 are buried in the fourth insulating film 99 by the method similar to that used to bury the second wirings 39 into the second insulating film 29, which is already described. Such fourth wirings 94 have a double-layered structure consisting of a barrier metal layer 92 and a copper film 93, and the barrier metal layer 92 is made of the refractory metal such as Ta (tantalum), for example. Because the CMP is executed after the fourth wirings 94 are buried, the substantially flat surface on which surfaces of the fourth wirings 94 and the fourth insulating film 99 are each continued can be obtained. Finally, a silicon nitride film 91 is formed on the fourth wirings 94 to protect the fourth wirings 94.

Though the embodiments of the present invention are explained in detail as above, the present invention is not limited to the above embodiments.

For example, in the above embodiments, the aluminum film may be used instead of the copper films 22, 31, 71, 93.

In addition, the upper insulating film 28 is not limited to the laminated structure consisting of the low-dielectric insulating film 26 and the silicon oxide film 27. The upper insulating film 28 may be made of the laminated body consisting of the silicon nitride film and the silicon oxide film, like the lower insulating film 38.

As described above, according to the semiconductor device of the present invention, because the dummy connection holes are provided in the second insulating film and then the dummy conductive plugs are formed by burying the second wiring in the holes, the stress-migration resistance can be improved.

Also, because the dummy wiring is provided in the non-forming region of the first wiring and then the dummy conductive plugs are connected to this dummy wiring by forming the dummy connection holes to reach this dummy wiring, the mechanical strength of the laminated body consisting of the insulating film and the second wiring can be enhanced.

Because the total wiring occupation ratio, incorporating both the first wiring and the dummy wiring, is substantially constant in the plane, polished heights of the dummy wiring and the first wiring can be easily controlled as desired in the CMP.

In addition, because the pitch p, between the neighboring dummy connection holes is set to less than 1 µm, the stress-migration can be reduced desirably.

In particular, if the pitch $p_1$ is set smaller than 0.6 µm, the stress-migration can be reduced more effectively.

Similarly, if the pitch $p_2$ between neighboring connection hole and dummy connection hole is set to less than 1 µm, the stress-migration can be reduced preferably.

Then, if this pitch $p_2$ is set smaller than 0.6 µm, the stress-migration can be reduced more effectively.

Further, because plural second wirings are provided such that the conductive plugs and the dummy conductive plugs are not opposed mutually in neighboring second wirings, the inter-wiring capacitance between neighboring second wirings can be reduced.

Moreover, the third wiring that is connected to the conductive plugs and the dummy conductive plugs may be arranged at the higher position than the second wiring. In this case, because the third wiring is provided such that the conductive plugs and the dummy conductive plugs are not opposed mutually in the second wiring and the third wiring if viewed from the upper side of the third wiring, the inter-wiring capacitance between the second wiring and the third wiring can be reduced.

Then, if the insulating film containing the low-dielectric insulating film is employed as the insulating film, the inter-wiring capacitance can be reduced and thus the operation speed of the semiconductor device can be increased.

What is claimed is:

1. A semiconductor device comprising:

a second insulating film formed on a substantially flat surface, on which a surface of a first wiring and a surface of a first insulating film are continued, to cover the first wiring;

a wiring trench formed in the second insulating film;

a connection hole formed in the second insulating film to extend from the wiring trench to the first wiring;

a dummy connection hole formed in the second insulating film to extend from the wiring trench to a non-forming region of the first wiring; and a second wiring buried in the connection hole and the wiring trench to be connected electrically to the first wiring and also buried in the dummy connection hole, and formed such that a surface of the second wiring and a surface of the second insulating film constitute a substantially flat surface, wherein the second wiring has a greater width than the first wiring and a plurality of dummy connection holes are provided around the connection hole.

2. A semiconductor device according to claim 1, wherein the second wiring is formed as a solid wiring.

* * * * *

UNITED STATES PATENT AND TRADEMARK OFFICE
CERTIFICATE OF CORRECTION

| | |
|---|---|
| PATENT NO. | : 7,067,919 B2 |
| APPLICATION NO. | : 10/309113 |
| DATED | : June 27, 2006 |
| INVENTOR(S) | : Watanabe et al. |

Page 1 of 1

It is certified that error appears in the above-identified patent and that said Letters Patent is hereby corrected as shown below:

On the Cover Page;
In item (30) Foreign Application Priority Data, change "Dec. 12, 2001 (JP) …. 2001-390710" to be -- Dec. 21, 2001 (JP) … 2001-390710 --

Signed and Sealed this

Seventh Day of November, 2006

JON W. DUDAS
*Director of the United States Patent and Trademark Office*